United States Patent
Huang et al.

(10) Patent No.: US 9,812,358 B1
(45) Date of Patent: Nov. 7, 2017

(54) FINFET STRUCTURES AND METHODS OF FORMING THE SAME

(71) Applicant: Taiwan Semiconductor Manufacturing Company, Ltd., Hsin-Chu (TW)

(72) Inventors: Yen-Chun Huang, New Taipei (TW); Ting-Ting Chen, New Taipei (TW); Yu-Chung Su, Hsin-Chu (TW); Ling-Fu Nieh, Taipei (TW); Pin-Chuan Su, Hsin-Chu (TW); Teng-Chun Tsai, Hsin-Chu (TW); Tai-Chun Huang, New Taipei (TW); Joy Cheng, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/264,718

(22) Filed: Sep. 14, 2016

(51) Int. Cl.
| | |
|---|---|
| *H01L 21/4763* | (2006.01) |
| *H01L 21/768* | (2006.01) |
| *H01L 23/522* | (2006.01) |
| *H01L 21/02* | (2006.01) |
| *H01L 21/3105* | (2006.01) |
| *H01L 21/311* | (2006.01) |
| *H01L 21/28* | (2006.01) |
| *H01L 29/66* | (2006.01) |
| *H01L 29/78* | (2006.01) |

(52) U.S. Cl.
CPC .. *H01L 21/76897* (2013.01); *H01L 21/02118* (2013.01); *H01L 21/02282* (2013.01); *H01L 21/02337* (2013.01); *H01L 21/28123* (2013.01); *H01L 21/31053* (2013.01); *H01L 21/31116* (2013.01); *H01L 21/31144* (2013.01); *H01L 23/5226* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |

(Continued)

*Primary Examiner* — Bradley K Smith
(74) *Attorney, Agent, or Firm* — Slater Matsil, LLP

(57) ABSTRACT

FinFET structures and methods of forming the same are disclosed. In a method, a recess is formed exposing a plurality of semiconductor fins on a wafer. A dummy contact material is formed in the recess. The dummy contact material contains carbon. The dummy contact material is cured with one or more baking steps. The one or more baking steps harden the dummy contact material. A first portion of the dummy contact material is replaced with an inter-layer dielectric. A second portion of the dummy contact material is replaced with a plurality of contacts. The plurality of contacts are electrically coupled to source/drain regions of the plurality of semiconductor fins.

20 Claims, 47 Drawing Sheets

(56) References Cited

U.S. PATENT DOCUMENTS

| | | |
|---|---|---|
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,536,980 B1 * | 1/2017 | Huang .................... H01L 29/78 |
| 2014/0001574 A1 | 1/2014 | Chen et al. |
| 2014/0110755 A1 | 4/2014 | Colinge |
| 2014/0151812 A1 | 6/2014 | Liaw |
| 2015/0041854 A1 * | 2/2015 | Wang ................ H01L 21/76856 257/190 |
| 2017/0117187 A1 * | 4/2017 | Ando .............. H01L 21/823807 |

* cited by examiner

FINFET STRUCTURES AND METHODS OF FORMING THE SAME

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, Fin Field-Effect Transistors (FinFETs) or multiple gate transistors are being researched and implemented. However, with this new device structure and the continuous shrinking of even FinFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
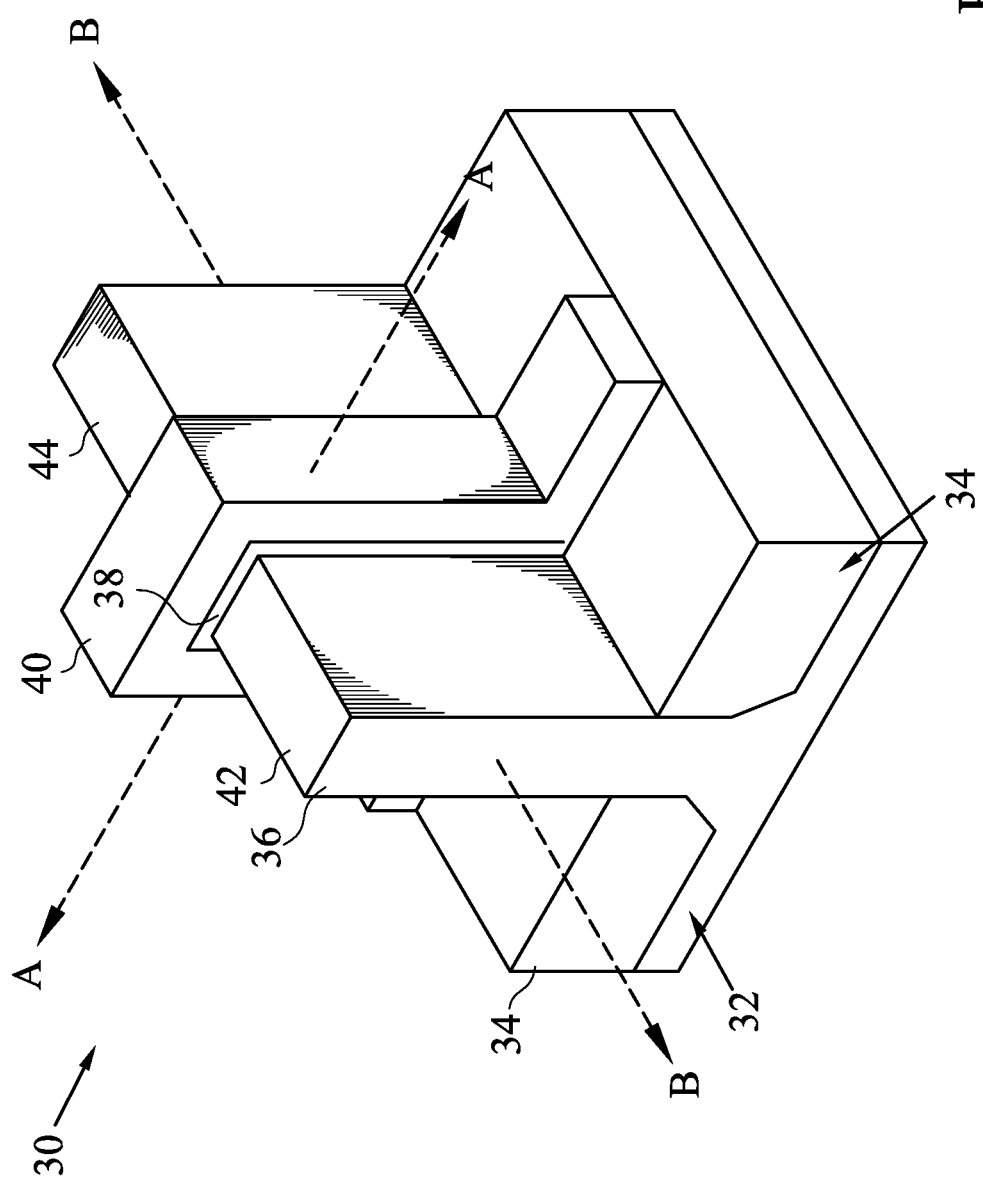
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. In particular, conductive contacts for FinFETs are described herein as being formed with a replacement contact technique. Replacement contacts are formed by forming a dummy contact, and then replacing the dummy contact with the conductive contact. The dummy contacts may be formed by transferring a replacement contact pattern to a dummy contact material through tri-layer lithography, which may include patterning a silicon-containing hardmask layer on the dummy contact material, and then forming a photoresist top layer on the silicon-containing hardmask layer. A dry etch process may be used to remove a portion of the dummy contact in subsequent processing steps, and an inter-layer dielectric (ILD) may be formed around the remaining dummy contacts. As semiconductor devices continue to decrease in size, the size of contact holes for the semiconductor devices will also decrease. Removing dummy contacts with a dry etch may become difficult as the size and aspect ratio of the contact holes decreases. Embodiment dummy contact materials may have improved gap-fill capabilities, may be able to sustain higher temperatures required to form hardmask layers, may have a higher chemical-mechanical polish (CMP) removal rate, and may have improved anisotropic dry etching performance. In particular, embodiment dummy contacts are formed from a spin-on-carbon (SOC) coating material having gap-fill capabilities suitable for devices of less than about 7 nm in size, a thermal budget greater than about 400° C., a CMP removal rate of greater than about 500 Å/min, and an anisotropic dry etching vertical angle of greater than about 88°. Some embodiments discussed herein are discussed in the context of FETs formed using a gate-last process. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a FinFET 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and the gate electrode 40. FIG. 1 further illustrates reference cross-sections that are used in some later figures. Cross-section A-A is across a channel, the gate dielectric 38, and the gate electrode 40 of the FinFET 30. Cross-section B-B is perpendicular to cross-section A-A and is along a longitudinal axis of the fin 36 and in a direction of, for example, a current flow between the source/drain regions 42 and 44.

FIGS. 2 through 22C are cross-sectional views, three-dimensional views, and top views of intermediate stages in the manufacturing of FinFETs, in accordance with an exemplary embodiment. FIGS. 2 through 6 illustrate reference cross-section A-A illustrated in FIG. 1, except for multiple FinFETs. In FIGS. 7A through 13B, figures ending with an "A" designation are illustrated along cross-section A-A of FIG. 1; and figures ending with a "B" designation are illustrated along cross-section B-B of FIG. 1. In FIGS.

14A-22C, figures ending with a "A" designation are three-dimensional views; figures ending with a "B" designation are illustrated along cross-section B-B of the three-dimensional view; and figures ending with a "C" designation are illustrated along cross-section C-C of the three-dimensional view.

Figure 2:
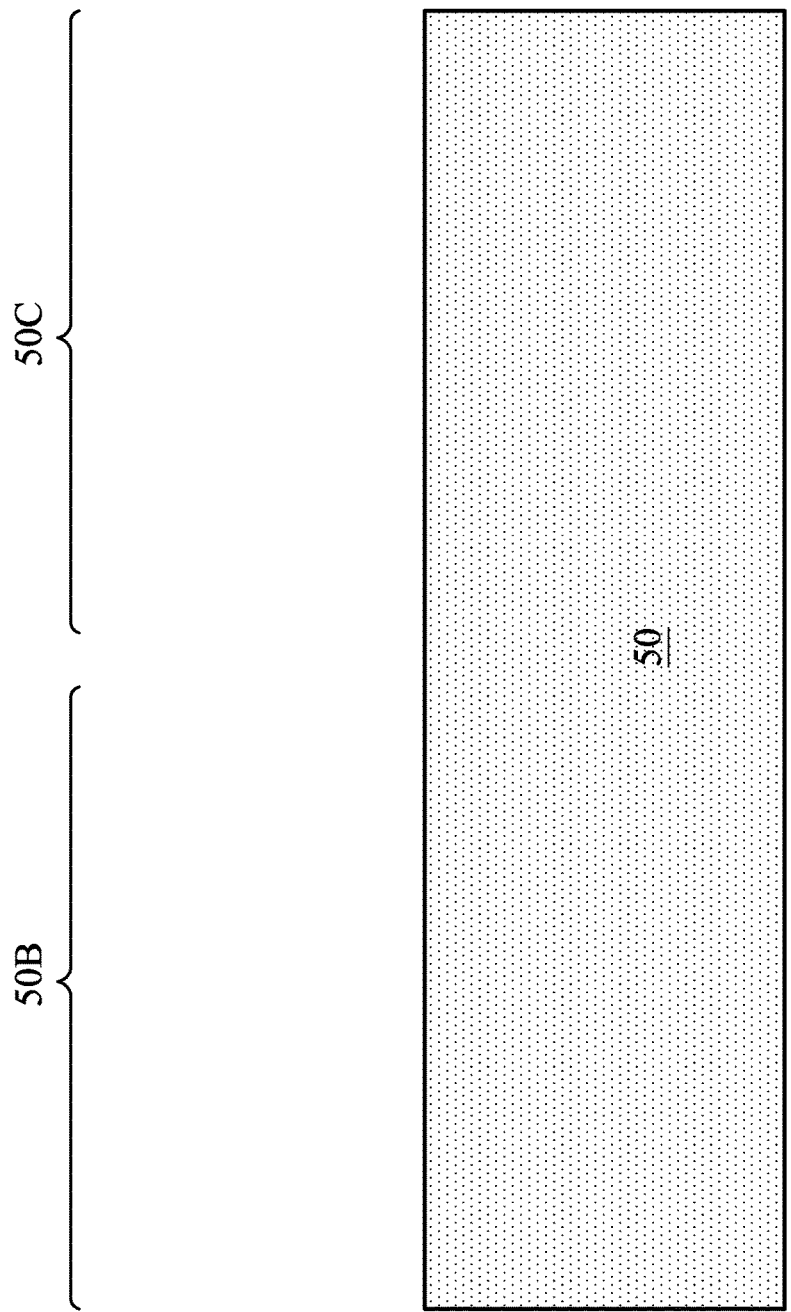
FIGS. 2 through 6, 7A-7B, 8A-8B, 9A-9B, 10A-10B, 11A-11B, 12A-12B, 13A-13B, 14A-14C, 15A-15C, 16A-16C, 17A-17C, 18A-18C, 19A-19C, 20A-20C, 21A-21C, and 22A-22C are cross-sectional views and three-dimensional views of intermediate stages in the manufacturing of FinFETs in accordance with some embodiments.

In FIG. 2, a substrate 50 is formed. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as NMOS transistors, e.g., n-type FinFETs. The second region 50C can be for forming p-type devices, such as PMOS transistors, e.g., p-type FinFETs. In some embodiments, both the first region 50B and the second region 50C are used to form the same type of devices, such as both regions being for n-type devices or p-type devices.

Figure 3:
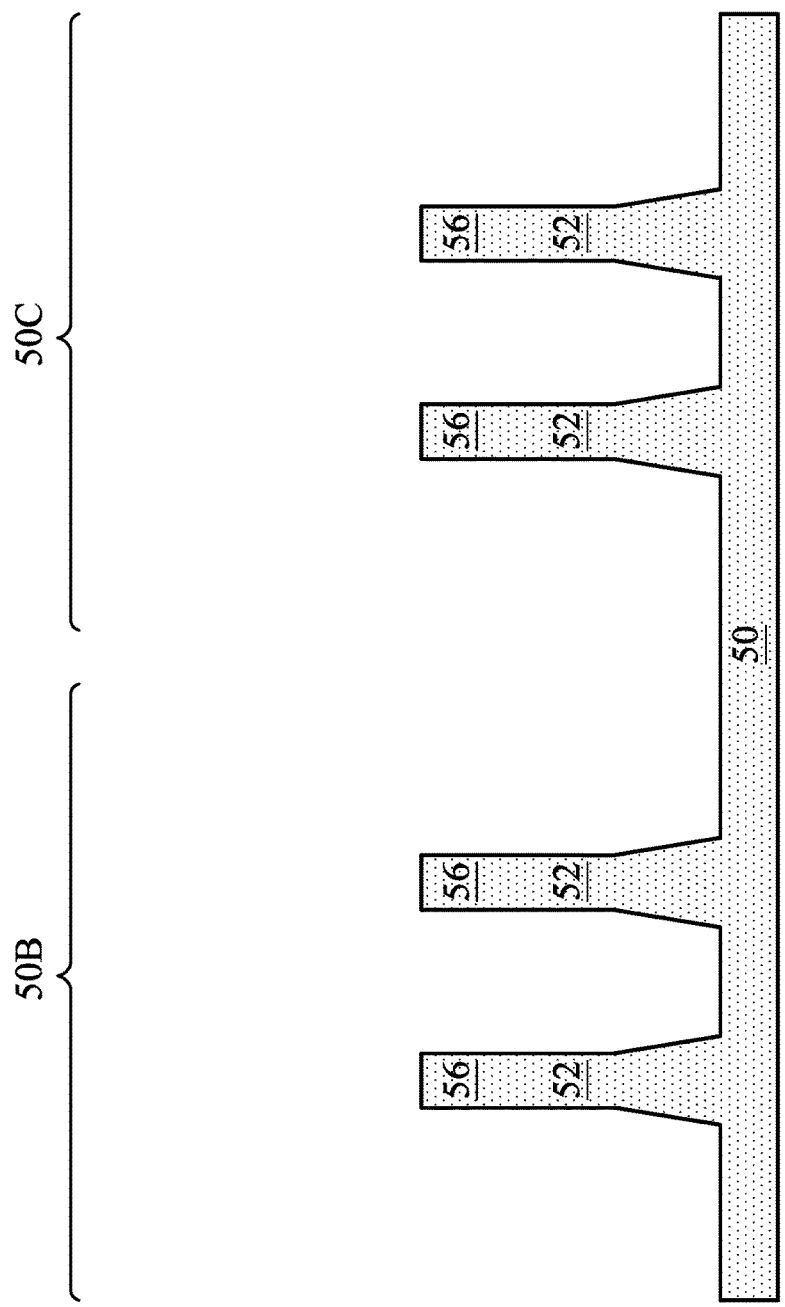
Figure 4:
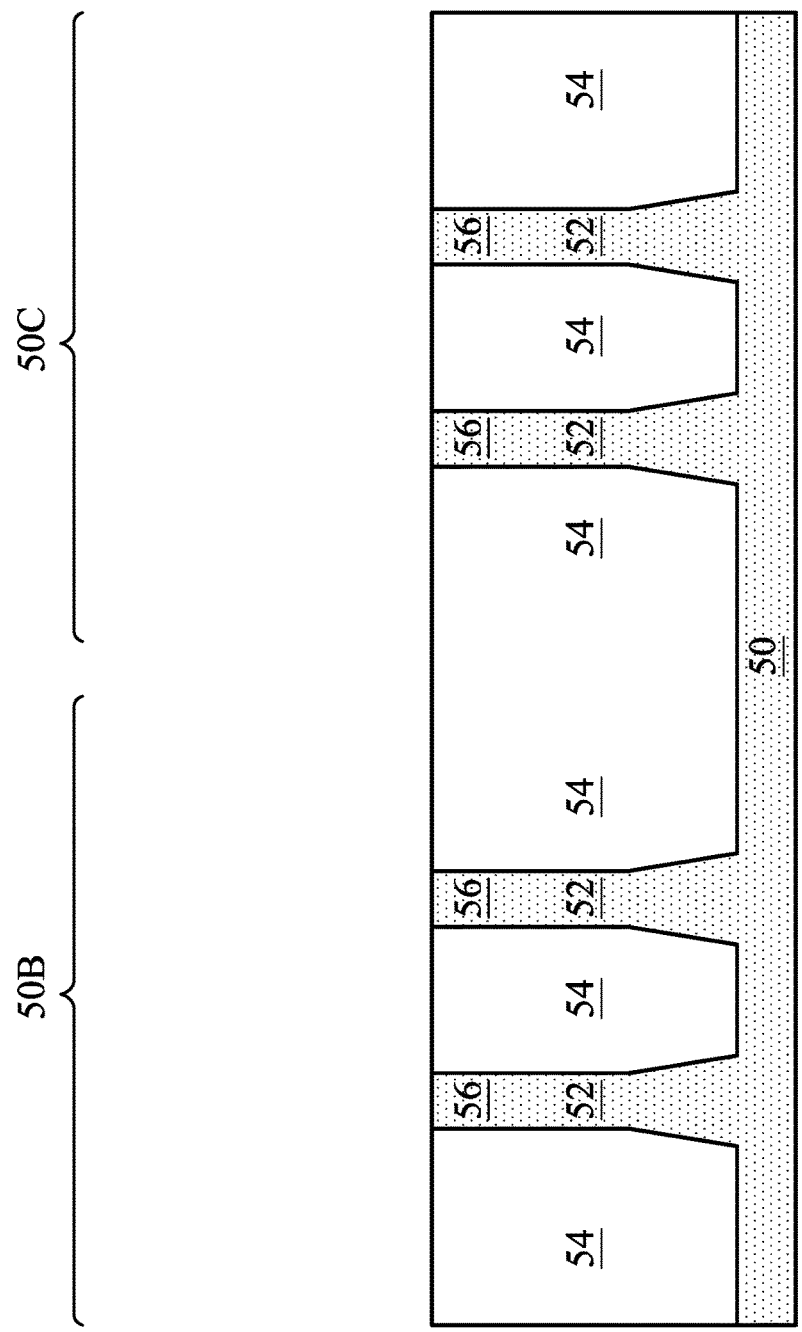

In FIGS. 3 and 4, fins 52 are formed, and isolation regions 54 are formed between neighboring fins 52. In FIG. 3, fins 52 are semiconductor strips formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4, an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. The insulating material 54 may be referred to as isolation regions 54. Further in FIG. 4, a planarization process, such as a chemical mechanical polish (CMP), may remove any excess insulation material 54 and form top surfaces of the isolation regions 54 and top surfaces of the fins 52 that are level.

Figure 5:
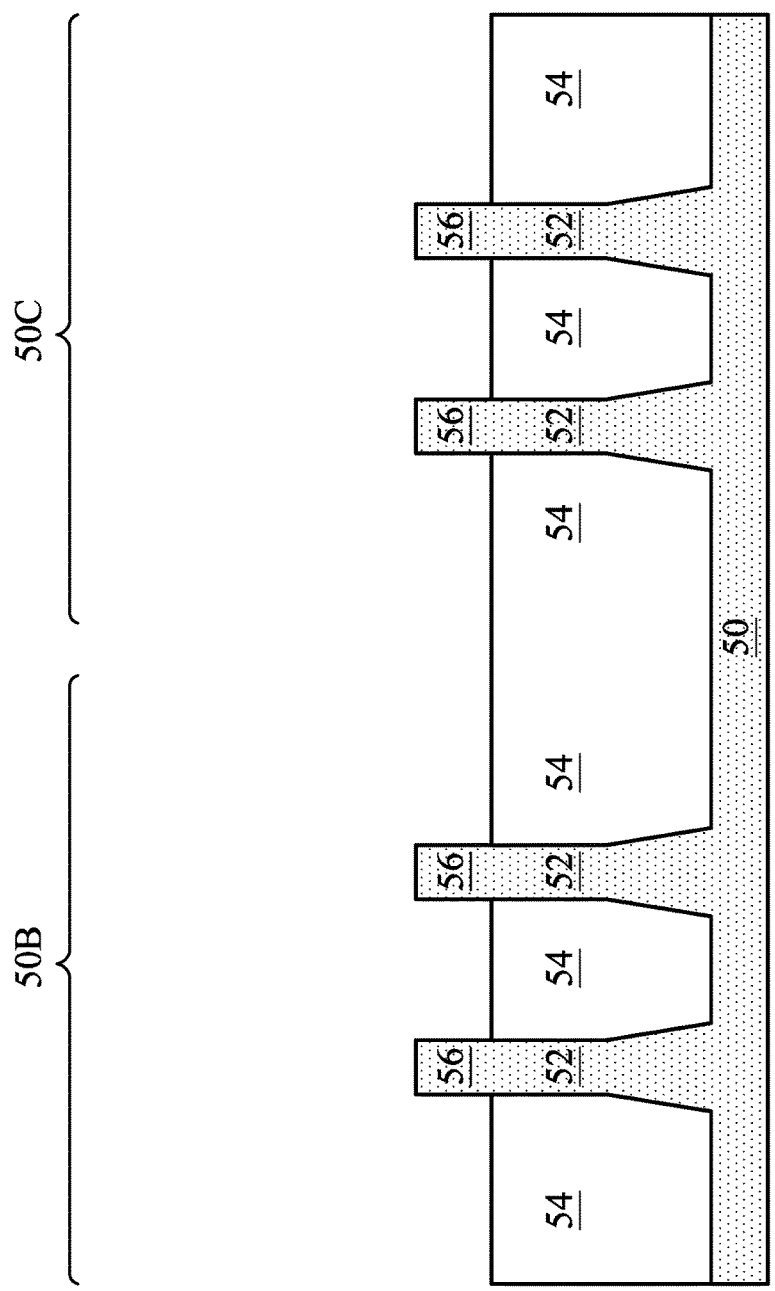

In FIG. 5, the isolation regions 54 are recessed to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how the fins 56 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 4 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may be formed from silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 5, appropriate wells (not shown) may be formed in the fins 56, the fins 52, and/or the substrate 50. In some embodiments, a P well may be formed in the first region 50B, and an N well may be formed in the second region 50C. In some embodiments, a P well or an N well are formed in both the first region 50B and the second region 50C.

In the embodiments with different well types, the different implant steps for the first region 50B and the second region 50C may be achieved using a photoresist or other masks (not shown). For example, a photoresist may be formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the second region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region 50C, such as the PMOS region. The p-type impurities may be boron, BF2, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the first region 50B and the second region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 6:
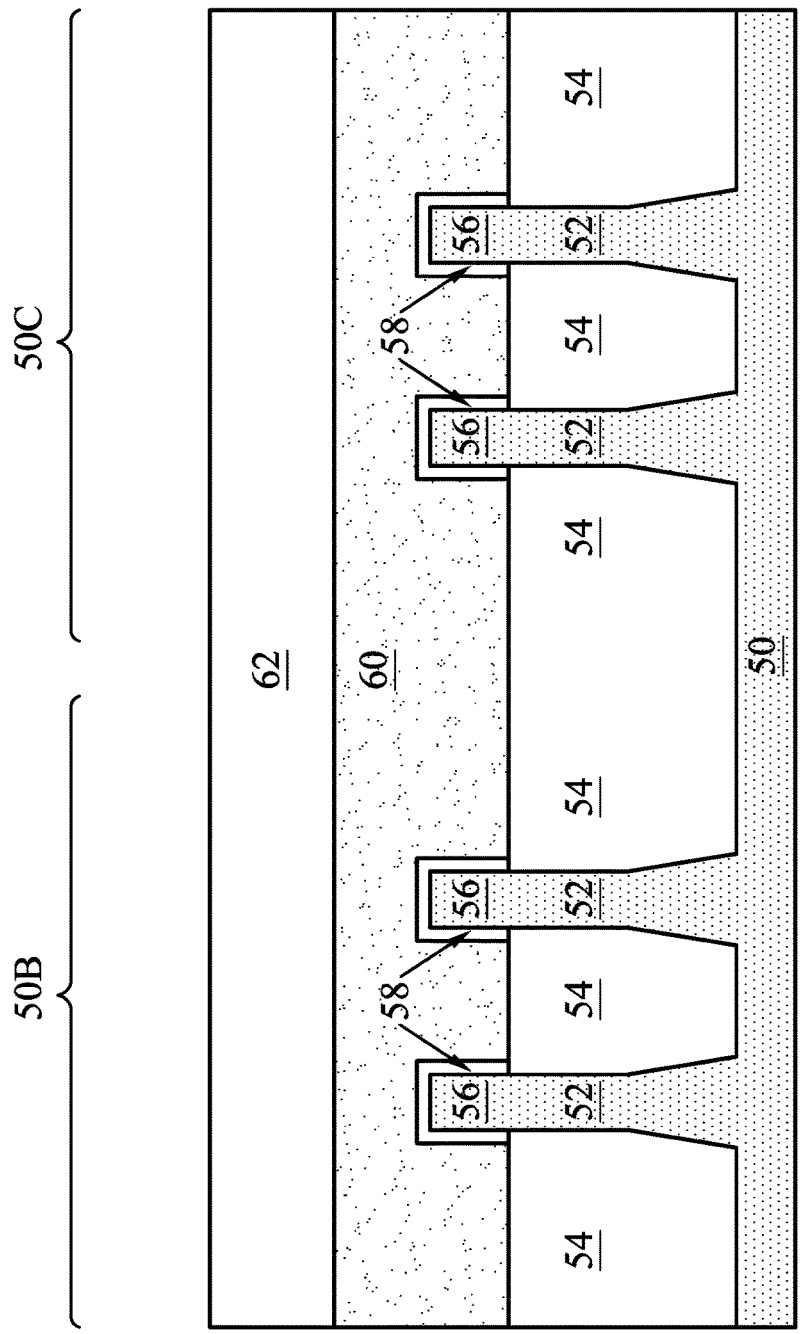

In FIG. 6, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 60 may be deposited by physical vapor deposition (PVD), CVD, sputter deposition, or other techniques known and used in the art for depositing conductive materials. The dummy gate layer 60 may be made of other materials that have a high etching selectivity from the etching of isolation regions. The mask layer 62 may include, for example, SiN, SiON, or the like. In this example, a single dummy gate layer 60 and a single mask layer 62 are formed across the first region 50B and the second region 50C. In some embodiments, separate dummy gate layers may be formed in the first region 50B and the second region 50C, and separate mask layers may be formed in the first region 50B and the second region 50C.

Figure 7A:
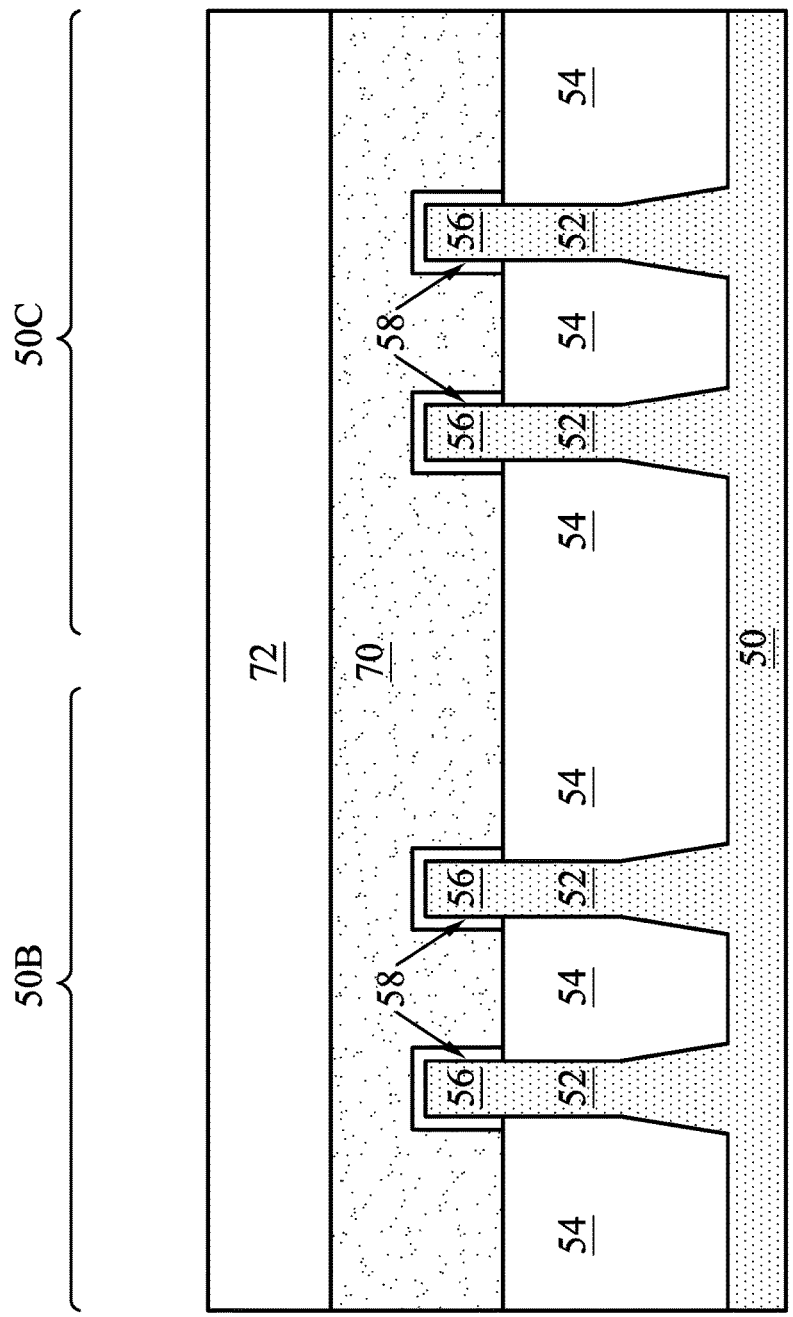
Figure 7B:
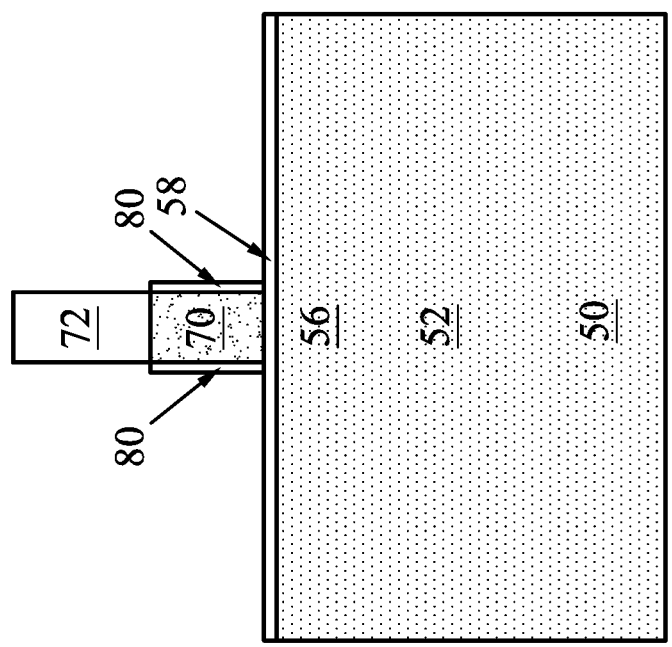

In FIGS. 7A and 7B, the mask layer 62 may be patterned using acceptable photolithography and etching techniques to form masks 72. The pattern of the masks 72 then may be transferred to the dummy gate layer 60 and dummy dielectric layer 58 by an acceptable etching technique to form dummy gates 70. The dummy gates 70 cover respective channel regions of the fins 56. The dummy gates 70 may also have a lengthwise direction substantially perpendicular to the lengthwise direction of respective epitaxial fins.

Further in FIGS. 7A and 7B, gate seal spacers 80 can be formed on exposed surfaces of dummy gates 70 and/or fins 56. A thermal oxidation or a deposition followed by an anisotropic etch may form the gate seal spacers 80.

After the formation of the gate seal spacers 80, implants for lightly doped source/drain (LDD) regions may be performed. In the embodiments with different device types, similar to the implants discussed above in FIG. 5, a mask, such as a photoresist, may be formed over the first region 50B, while exposing the second region 50C, and appropriate type (e.g., n-type or p-type) impurities may be implanted into the exposed fins 56 in the second region 50C. The mask may then be removed. Subsequently, a mask, such as a photoresist, may be formed over the second region 50C while exposing the first region 50B, and appropriate type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 8A:
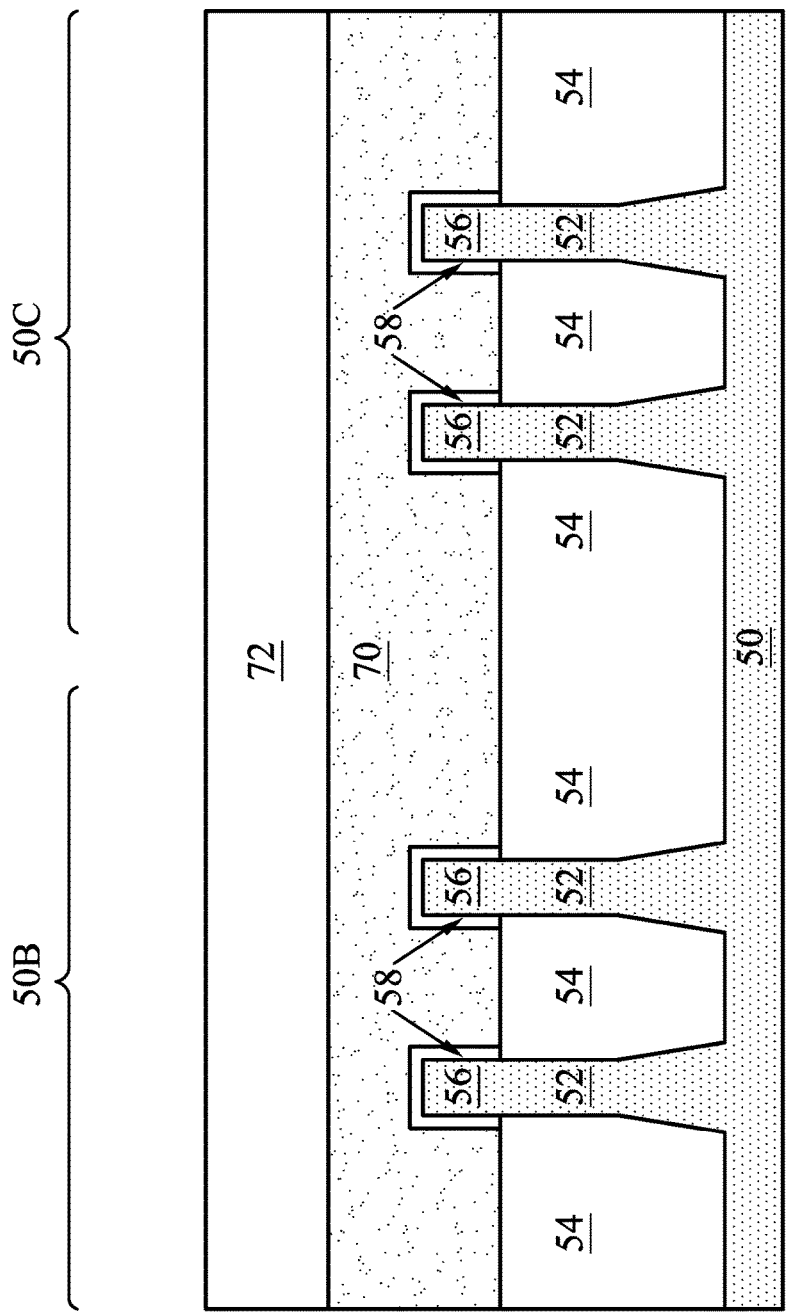
Figure 8B:
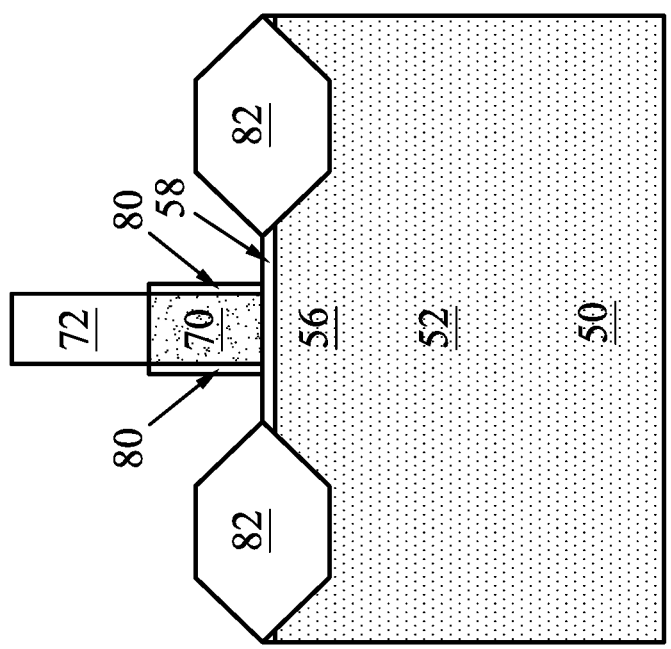

In FIGS. 8A and 8B, epitaxial source/drain regions 82 are formed in the fins 56. The epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52.

In the embodiments with different device types, the epitaxial source/drain regions 82 in the regions may be formed in separated processes. In these embodiments, the epitaxial source/drain regions 82 in the first region 50B may be formed by masking the second region 50C and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. If the first region 50B is an n-type device region, the epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. If the first region 50B is a p-type device region, the epitaxial source/drain regions 82 may include any acceptable material, such as appropriate for p-type FinFETs. For example, if the fin 56 is silicon, the epitaxial source/drain regions 82 may be formed from SiGe, SiGeB, Ge, GeSn, or the like. The epitaxial source/drain regions 82 in the first region 50B may have surfaces raised from respective surfaces of the fins 56 and may have facets. Subsequently, the dummy gate spacers in the first region 50B are removed, for example, by an etch, as is the mask on the second region 50C.

After the formation of the epitaxial source/drain regions 82 in the first region 50B, the epitaxial source/drain regions 82 in the second region 50C may be formed by masking the first region 50B and conformally depositing a dummy spacer layer in the second region 50C, followed by an anisotropic etch to form dummy gate spacers (not shown) along sidewalls of the dummy gates 70 and/or gate seal spacers 80 in the second region 50C. Then, source/drain regions of the epitaxial fins in the second region 50C are etched to form recesses. The epitaxial source/drain regions 82 in the second region 50C are epitaxially grown in the recesses. The epitaxial source/drain regions 82 in the second region 50C may include any acceptable material, such as appropriate for p-type FinFETs or n-type FinFETs, as described above. The epitaxial source/drain regions 82 in the second region 50C may have surfaces raised from respective surfaces of the fins 56 and may have facets. Subsequently, the dummy gate spacers in the second region 50C are removed, for example, by an etch, as is the mask on the first region 50B.

Figure 9A:
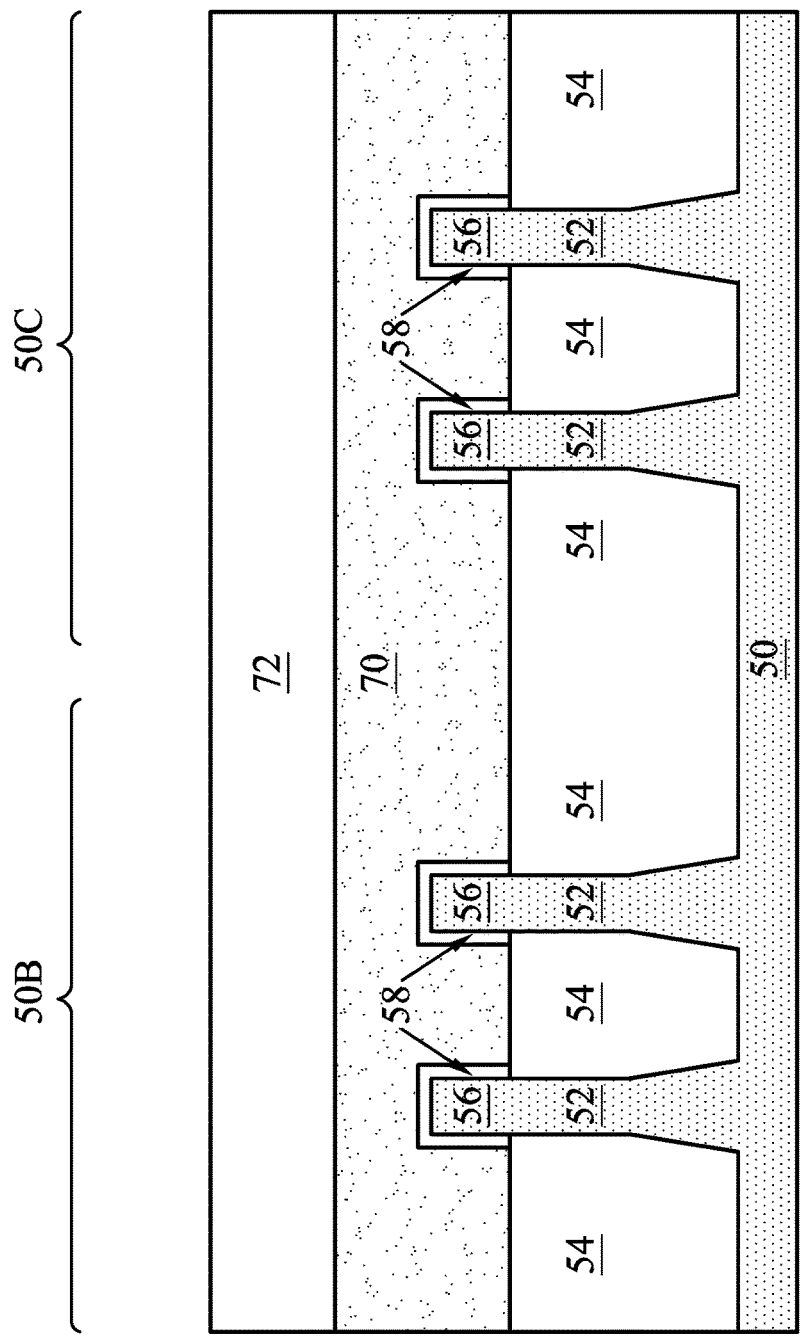
Figure 9B:
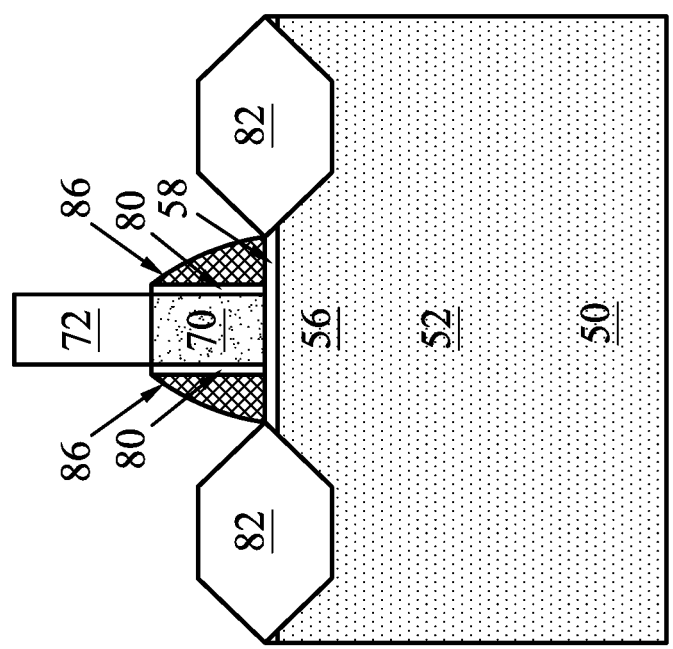

In FIGS. 9A and 9B, gate spacers 86 are formed on the gate seal spacers 80 along sidewalls of the dummy gates 70. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and/or epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 10A:
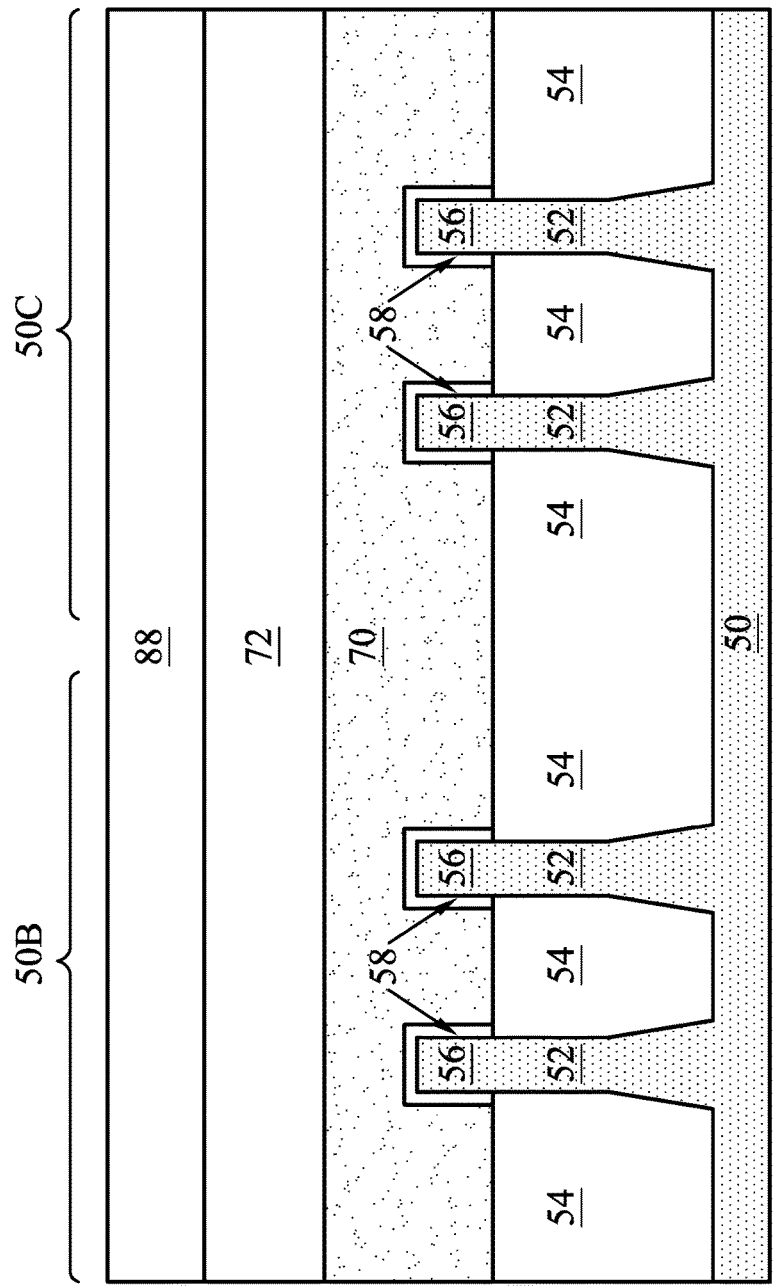
Figure 10B:
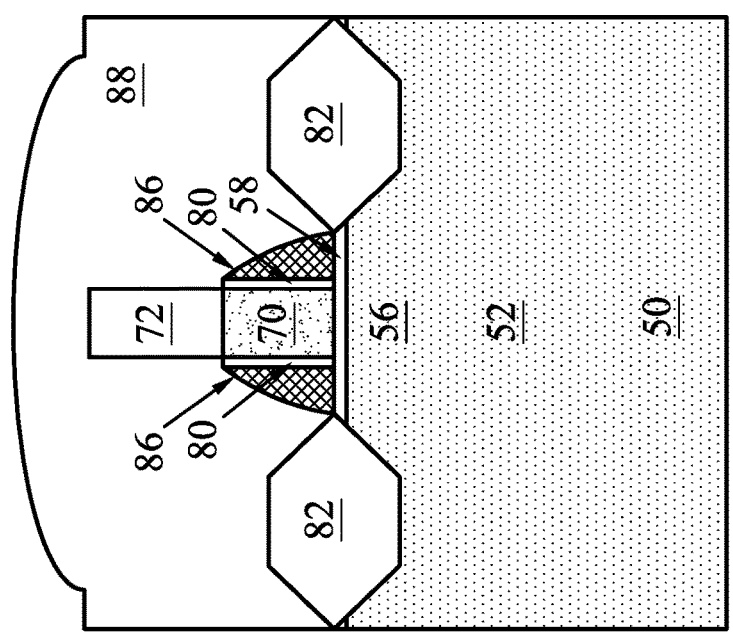

In FIGS. 10A and 10B, a dummy ILD 88 is deposited over the structure illustrated in FIGS. 9A and 9B. The dummy ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium (Si$_x$Ge$_{1-x}$, where x can be between approximately 0 and 100), pure Germanium, or the like. Other insulation or semiconductor materials formed by any acceptable process may be used.

Figure 11A:
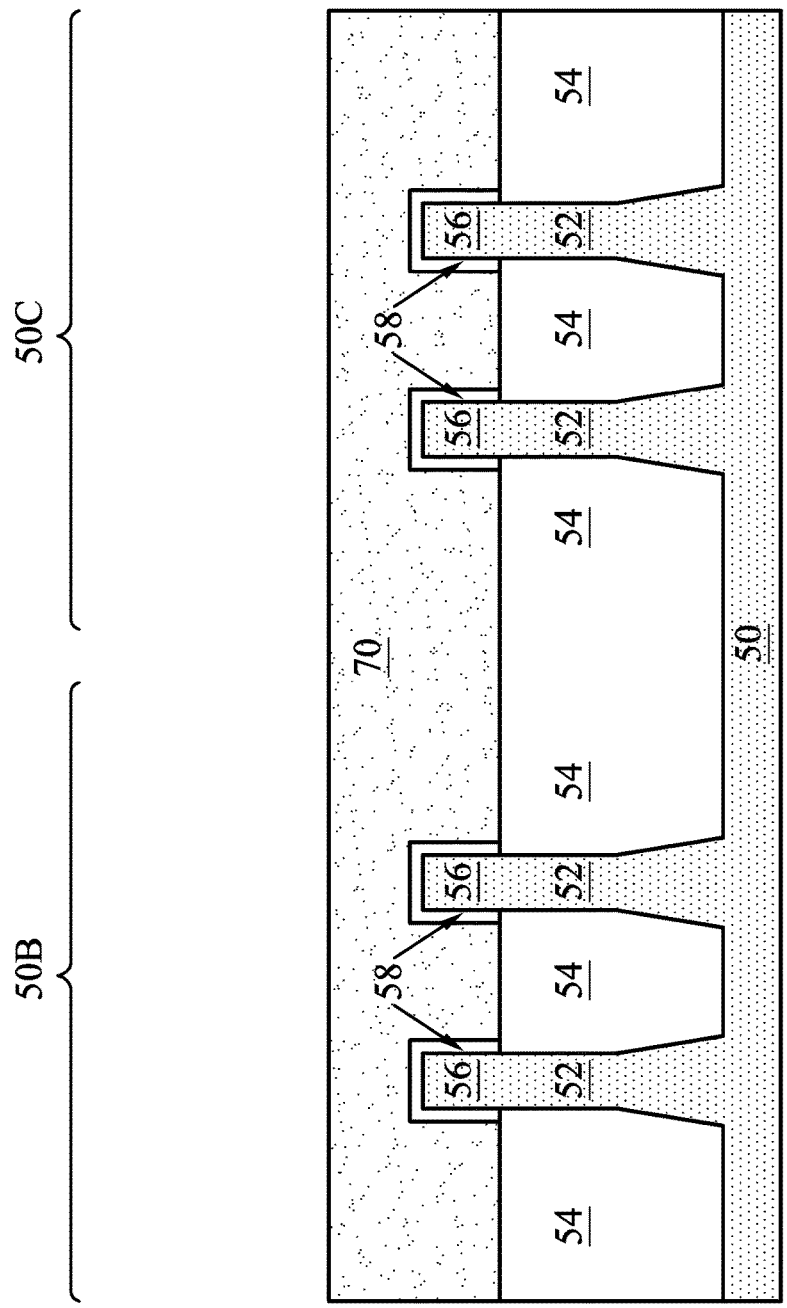
Figure 11B:
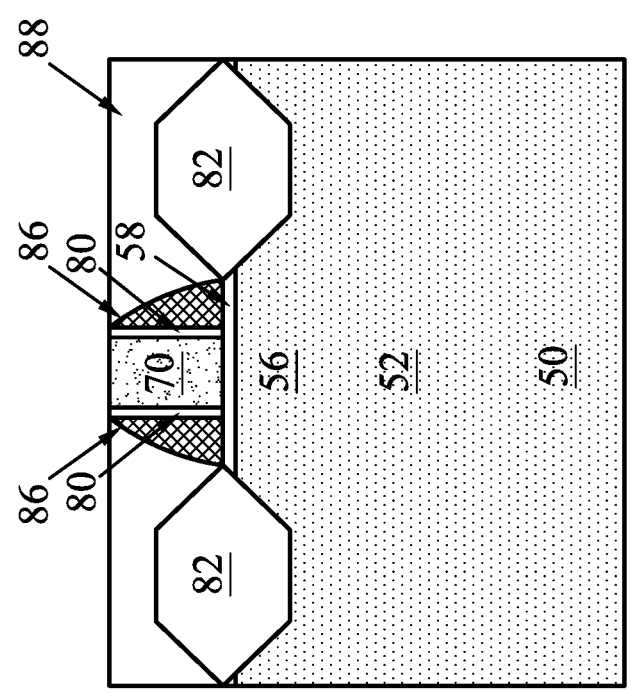

In FIGS. 11A and 11B, a planarization process, such as a CMP, may be performed to level the top surface of dummy ILD 88 with the top surfaces of the dummy gates 70. The CMP may also remove the masks 72 on the dummy gates 70. Accordingly, top surfaces of the dummy gates 70 are exposed through the dummy ILD 88.

Figure 12A:
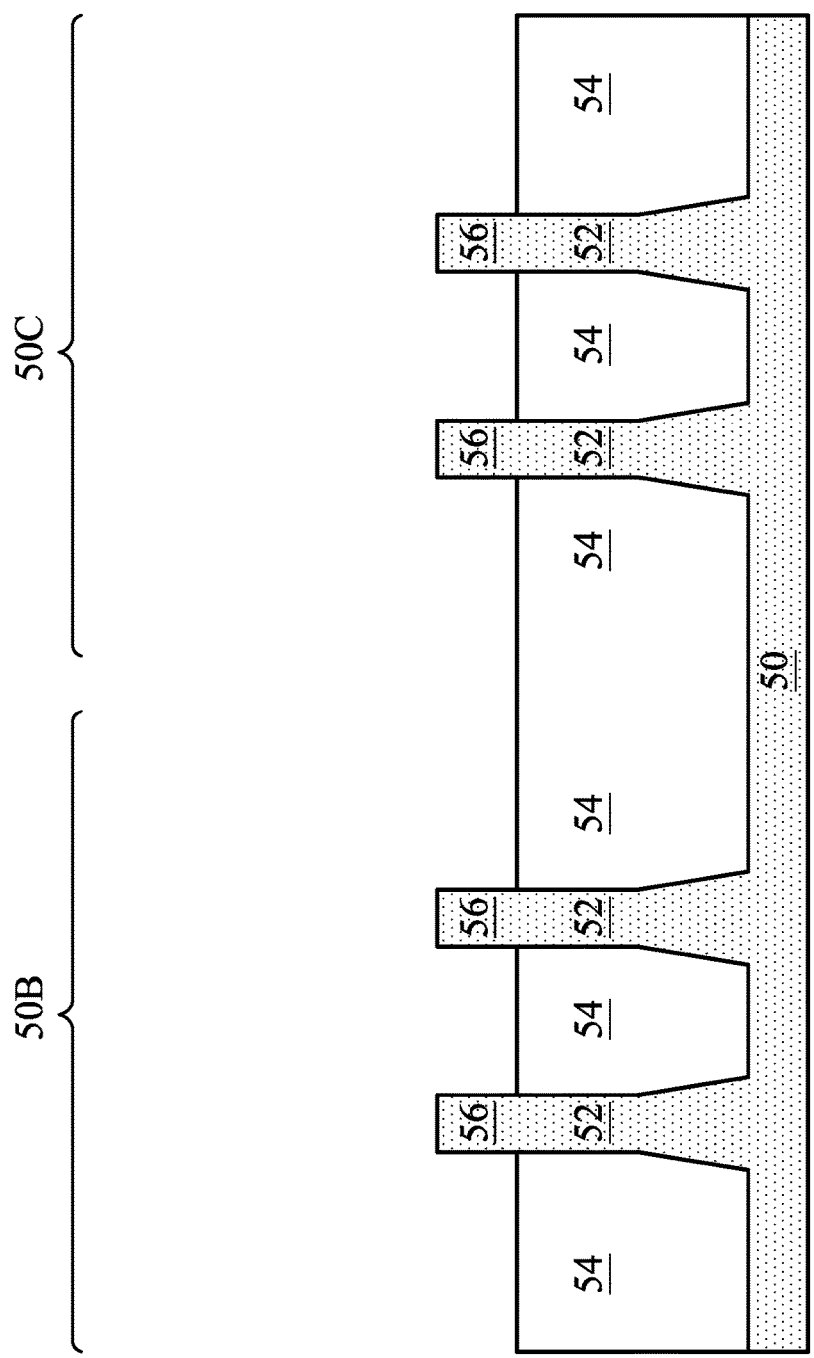
Figure 12B:
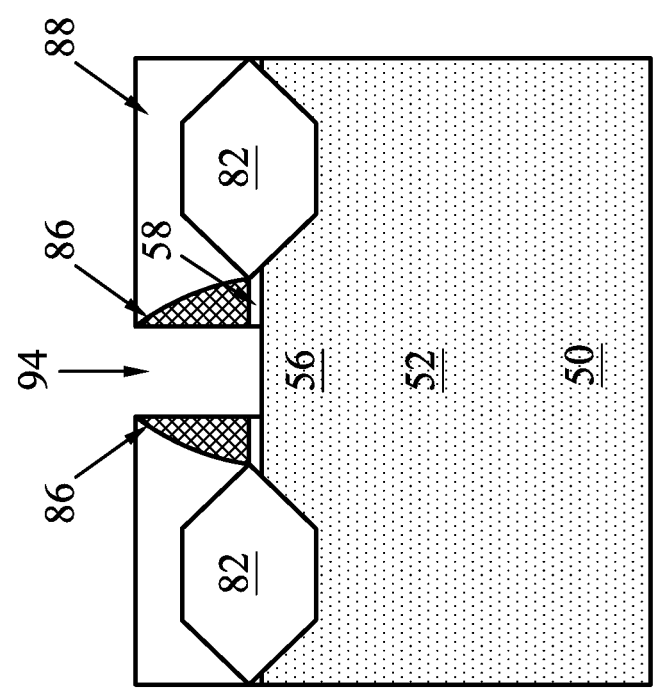

In FIGS. 12A and 12B, the exposed portions of the dummy gates 70, the gate seal spacers 80, and portions of the dummy dielectric layer 58 directly underlying the exposed dummy gates 70 are removed in an etching step(s), so that recesses 94 are formed. In some embodiments, the dummy gates 70 are removed by an anisotropic dry etch process. For example, the etching process may include a dry etch process using reaction gas(es) that selectively etch the dummy gates 70 without etching the dummy ILD 88 or the gate spacers 86. Each recess 94 exposes a channel region of a respective fin. Each channel region is disposed between neighboring pairs of the epitaxial source/drain regions 82. During the removal, the dummy dielectric layer 58 may be used as an etch stop layer when the dummy gates 70 are etched. The dummy dielectric layer 58 and the gate seal spacers 80 may then be removed after the removal of the dummy gates 70.

Figure 13A:
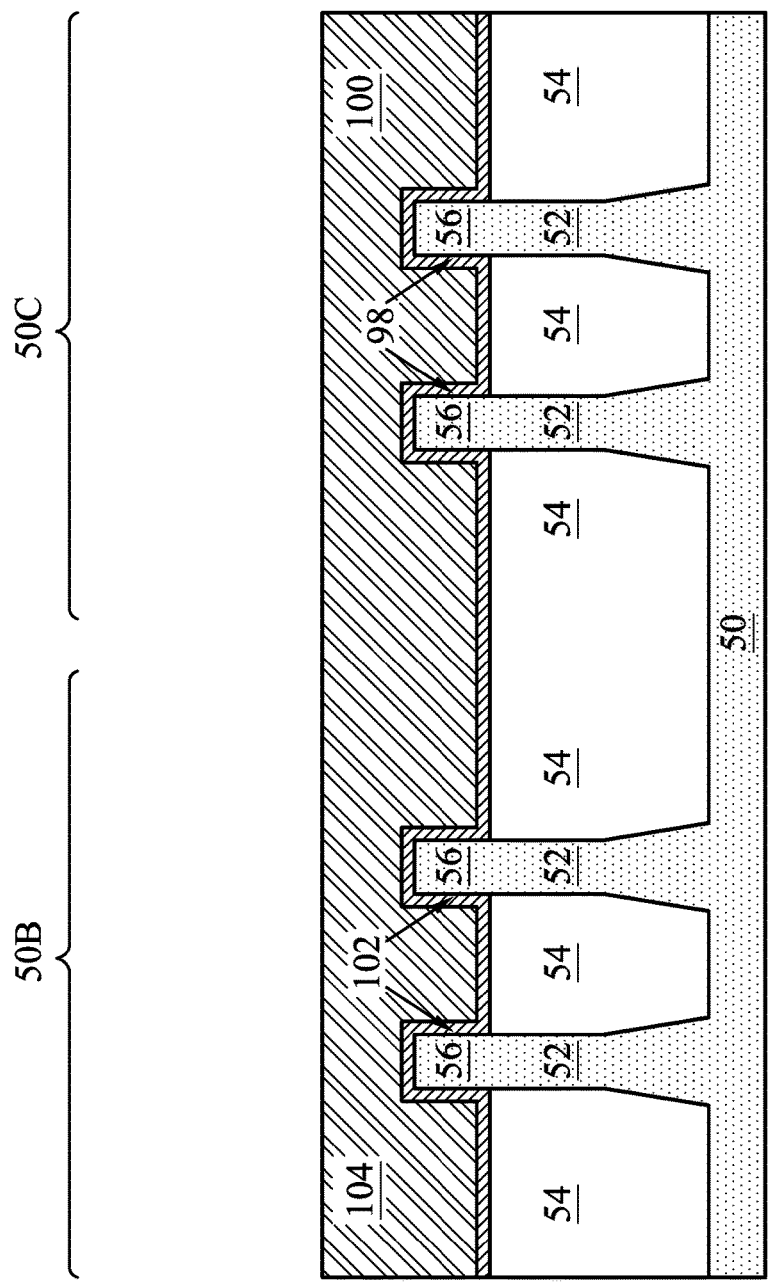
Figure 13B:
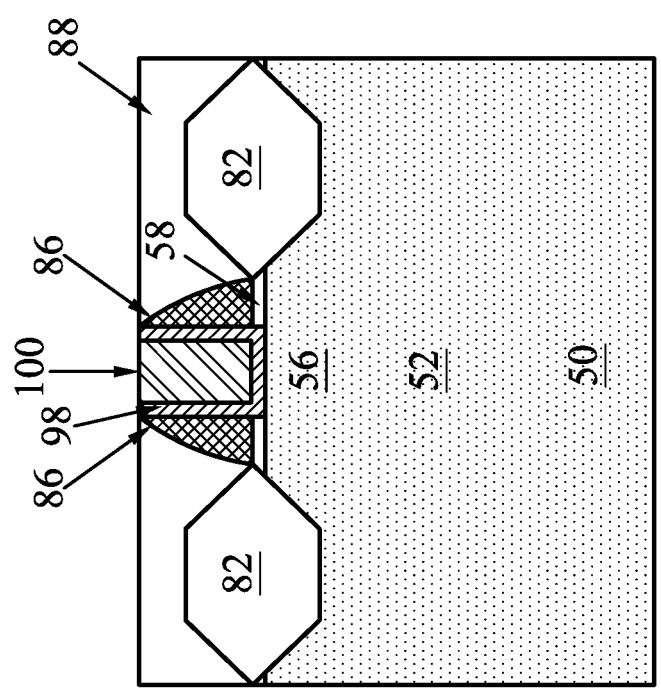

In FIGS. 13A and 13B, gate dielectric layers 98 and 102 and gate electrodes 100 and 104 are formed for replacement gates. Gate dielectric layers 98 and 102 are deposited conformally in the recesses 94, such as on the top surfaces and the sidewalls of the fins 56 and on sidewalls of the gate spacers 86, and on a top surface of the dummy ILD 88. In accordance with some embodiments, the gate dielectric layers 98 and 102 are silicon oxide, silicon nitride, or multilayers thereof. In some embodiments, the gate dielectric layers 98 and 102 are a high-k dielectric material, and in these embodiments, the gate dielectric layers 98 and 102 may have a k value greater than about 7.0, and may include a metal oxide or a silicate of Hf, Al, Zr, La, Mg, Ba, Ti, Pb, and combinations thereof. The formation methods of the gate dielectric layers 98 and 102 may include Molecular-Beam Deposition (MBD), Atomic Layer Deposition (ALD), PECVD, and the like.

The gate electrodes 100 and 104 are deposited over the gate dielectric layers 98 and 102, respectively, and fill the remaining portions of the recesses 94. The gate electrodes 100 and 104 may be a metal-containing material such as TiN, TaN, TaC, Co, Ru, Al, combinations thereof, or multi-layers thereof. After the filling of the gate electrodes 100 and 104, a planarization process, such as a CMP, may be performed to remove the excess portions of the gate dielectric layers 98 and 102 and the material of the gate electrodes 100 and 104, which excess portions are over the top surface of the dummy ILD 88. The resulting remaining portions of material of the gate electrodes 100 and 104 and the gate dielectric layers 98 and 102 thus form replacement gates of the resulting FinFETs.

The formation of the gate dielectric layers 98 and 102 may occur simultaneously such that the gate dielectric layers 98 and 102 are formed from the same materials, and the formation of the gate electrodes 100 and 104 may occur simultaneously such that the gate electrodes 100 and 104 are formed from the same materials. In some embodiments, the gate dielectric layers 98 and 102 may be formed by distinct processes, such that the gate dielectric layers 98 and 102 may be different materials, and the gate electrodes 100 and 104 may be formed by distinct processes, such that the gate electrodes 100 and 104 may be different materials. Various masking steps may be used to mask and expose appropriate regions when using distinct processes.

Figure 14A:
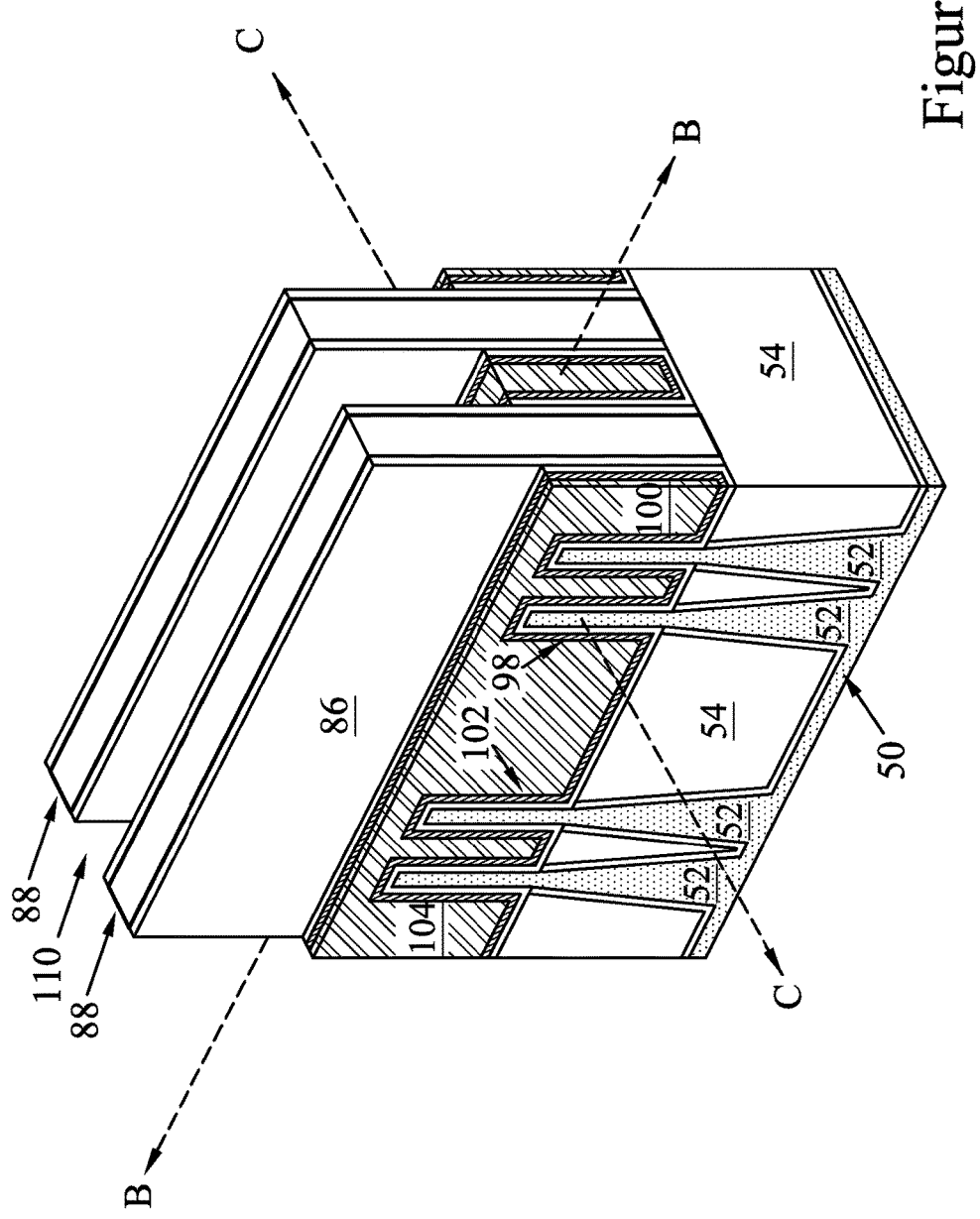
Figure 14B:
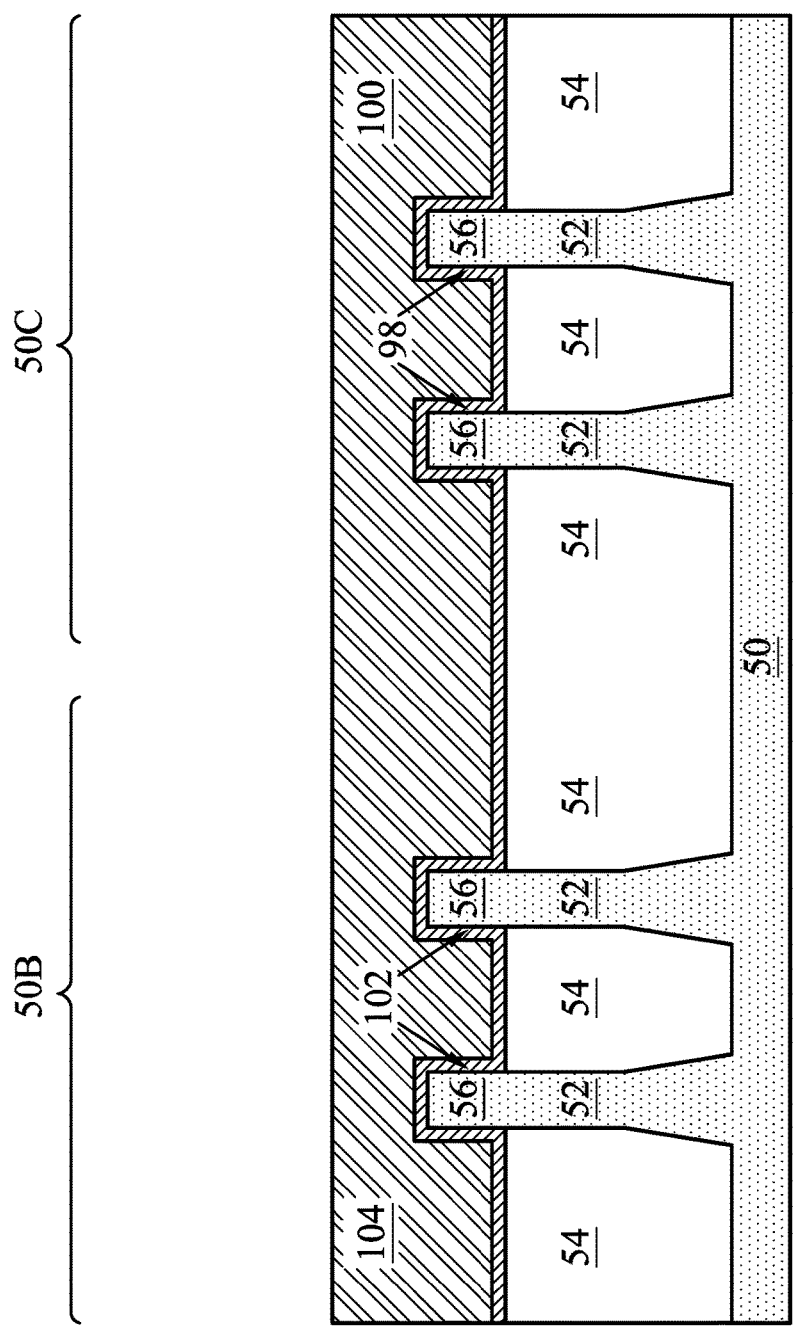
Figure 14C:
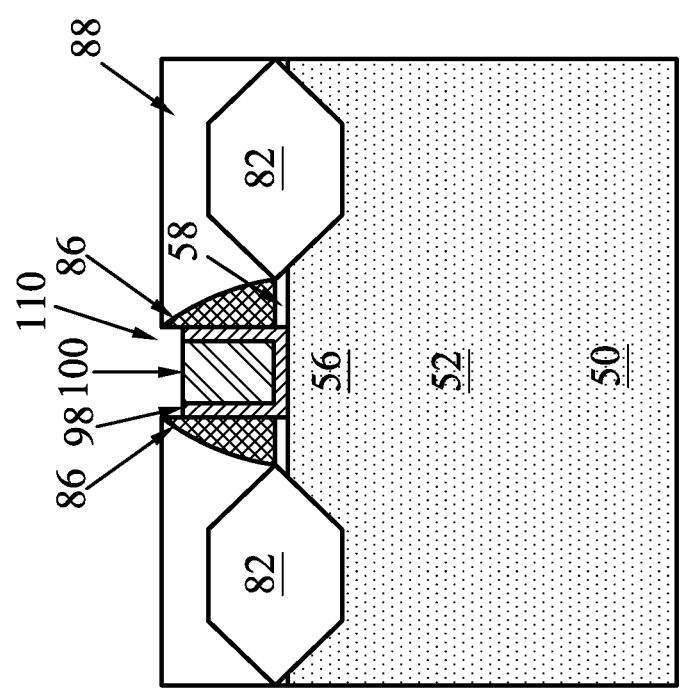

In FIGS. 14A, 14B, and 14C, the gate dielectric layers 98 and 102 and the gate electrodes 100 and 104 are recessed in an etching step(s), so that recesses 110 are formed. The etching step(s) may include an anisotropic dry etch. For example, the etching step(s) may include a dry etch process using reaction gas(es) that selectively etch the gate dielectric layers 98 and 102 and the gate electrodes 100 and 104 without etching the dummy ILD 88 or the gate spacers 86.

Figure 15A:
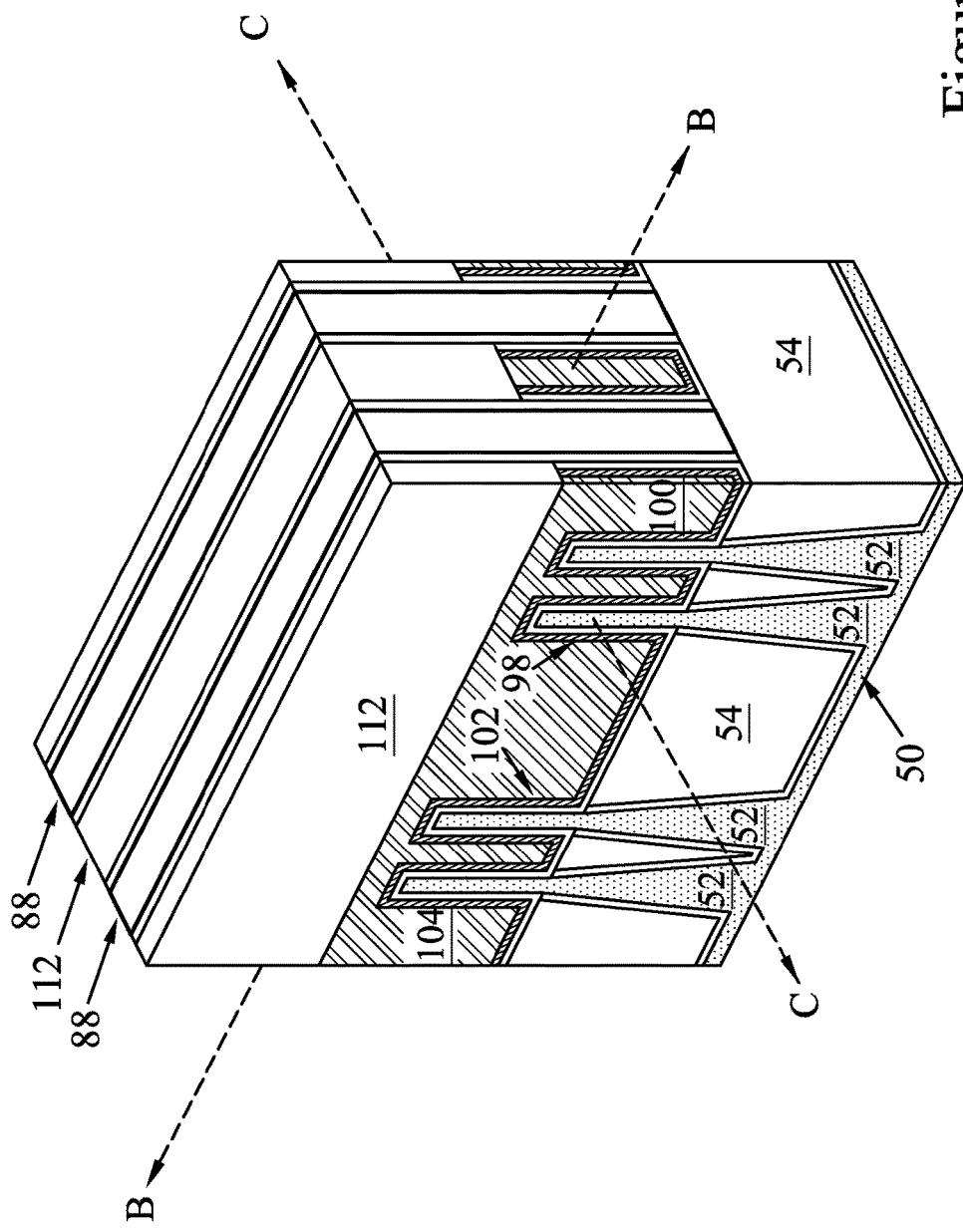
Figure 15B:
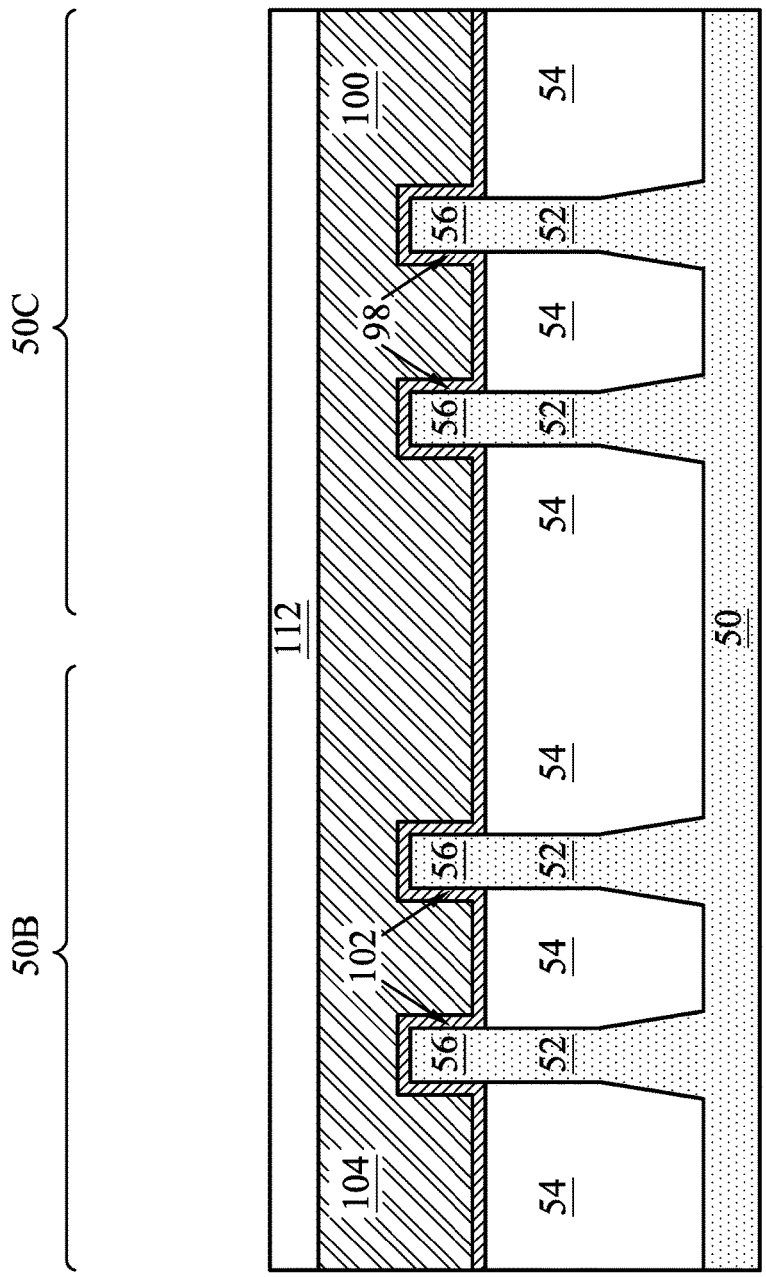
Figure 15C:
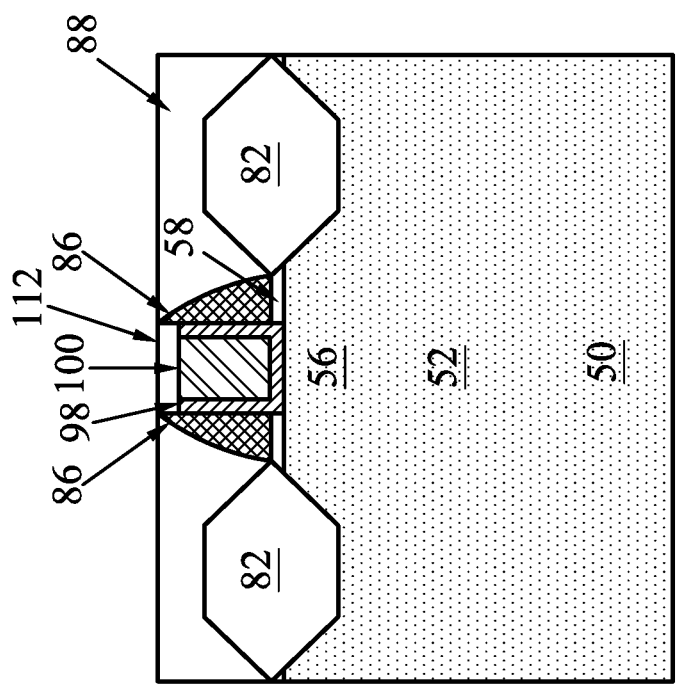

In FIGS. 15A, 15B, and 15C, a hardmask 112 is formed in the recesses 110 and over the gate dielectric layers 98 and 102 and the gate electrodes 100 and 104. The hardmask 112 provides protection for the gate spacers 86 during subsequent self-aligned contact etching steps to ensure that the self-aligned contact does not short one of the gate electrodes 100 and 104 to the corresponding epitaxial source/drain regions 82. The hardmask 112 may be made of a metal, a metal oxide, a metal nitride, pure silicon, the like, or a combination thereof. Some examples of the metal oxide and metal nitride are TiO, HfO, AlO, ZrO, ZrN, the like, or a combination thereof. The material composition of the hardmask 112 may ensure a high film density and a non-volatile etching byproduct, such as, for example a metal fluoride etching byproduct. The hardmask 112 may be formed by CVD, PVD, ALD, a spin-on-dielectric process, the like, or a combination thereof. After the hardmask 112 is formed, a CMP may be performed so that the top surfaces of the hardmask 112, the dummy ILD 88, and the gate spacers 86 are level.

Figure 16A:
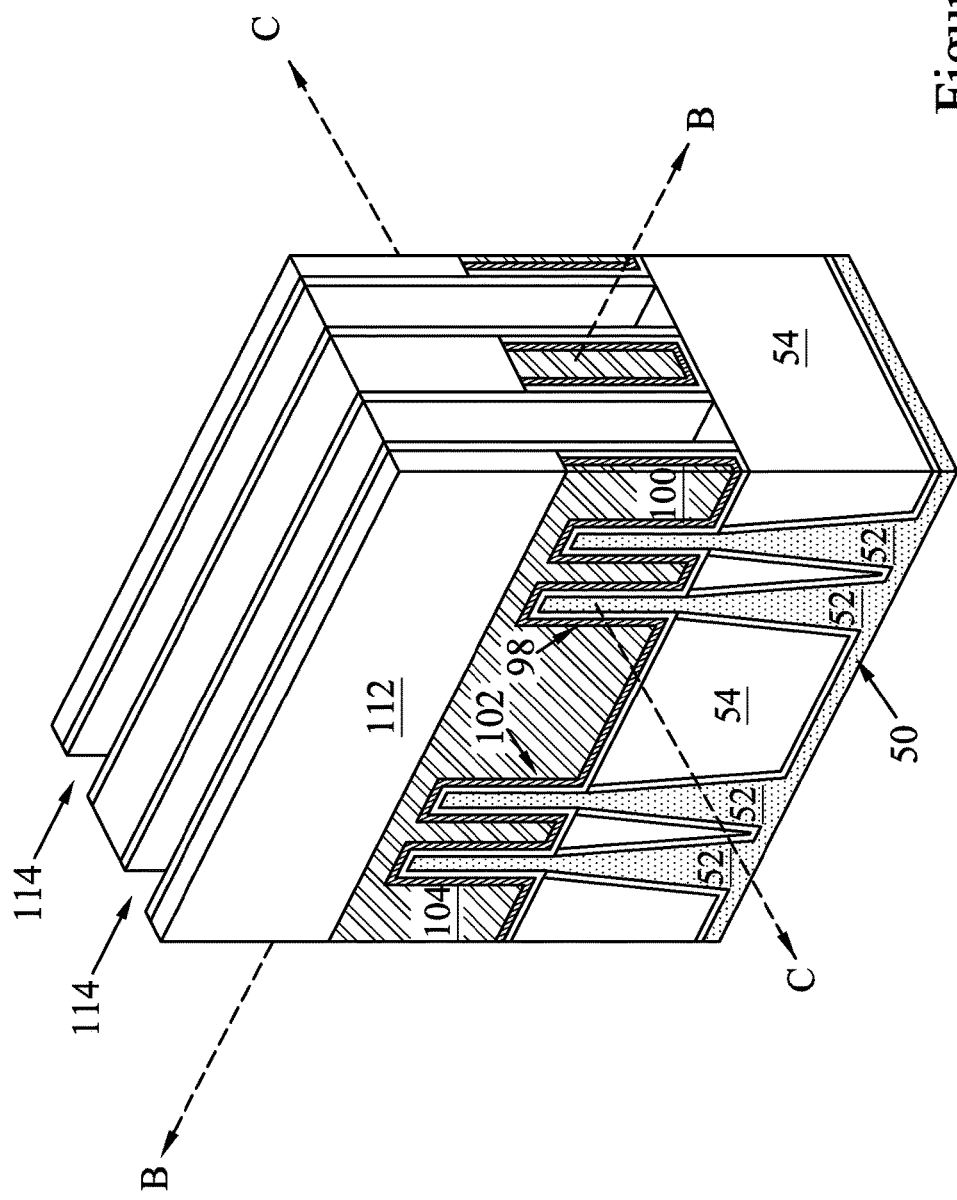
Figure 16B:
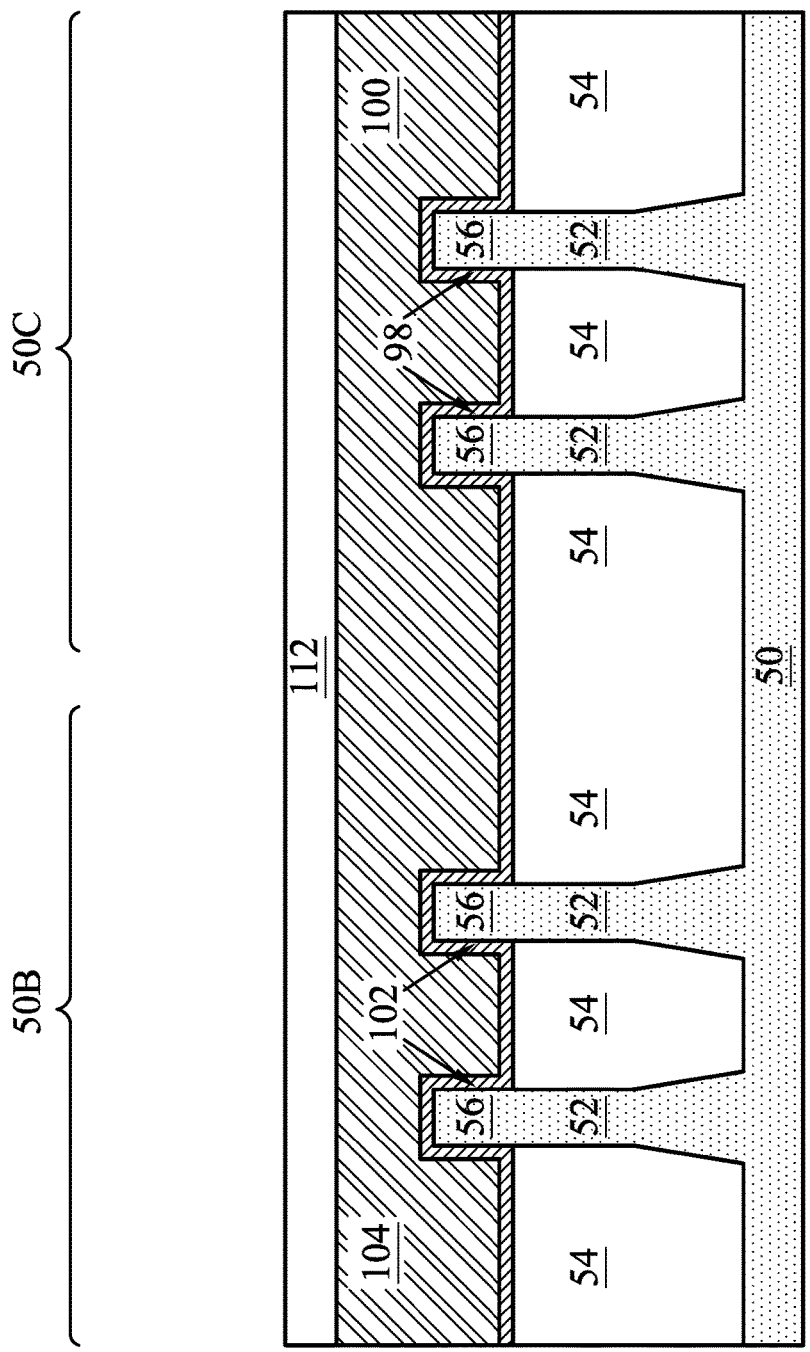
Figure 16C:
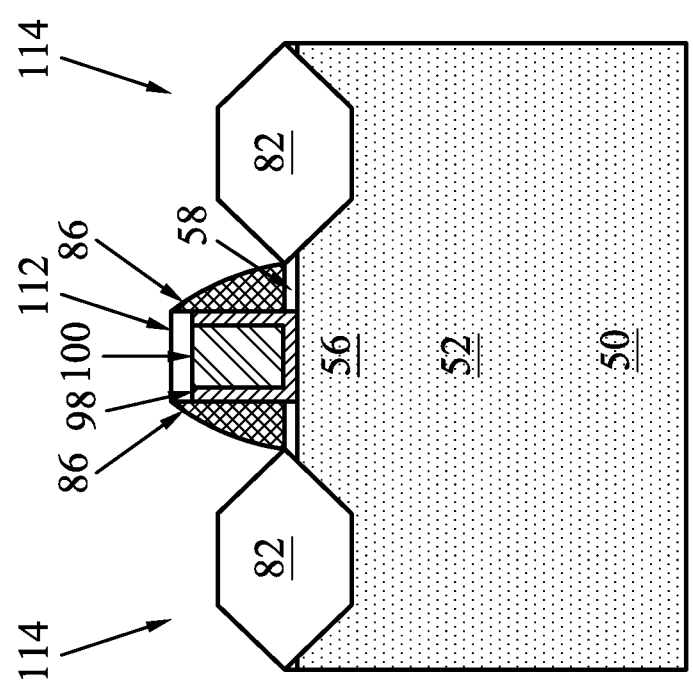

In FIGS. 16A, 16B, and 16C, the dummy ILD 88 is removed to form recesses 114. The recesses 114 expose the epitaxial source/drain regions 82. The dummy ILD 88 may be removed with an acceptable etch process that is selective to the dummy ILD 88 and does not remove the gate spacers 86 or the hardmask 112.

Figure 17A:
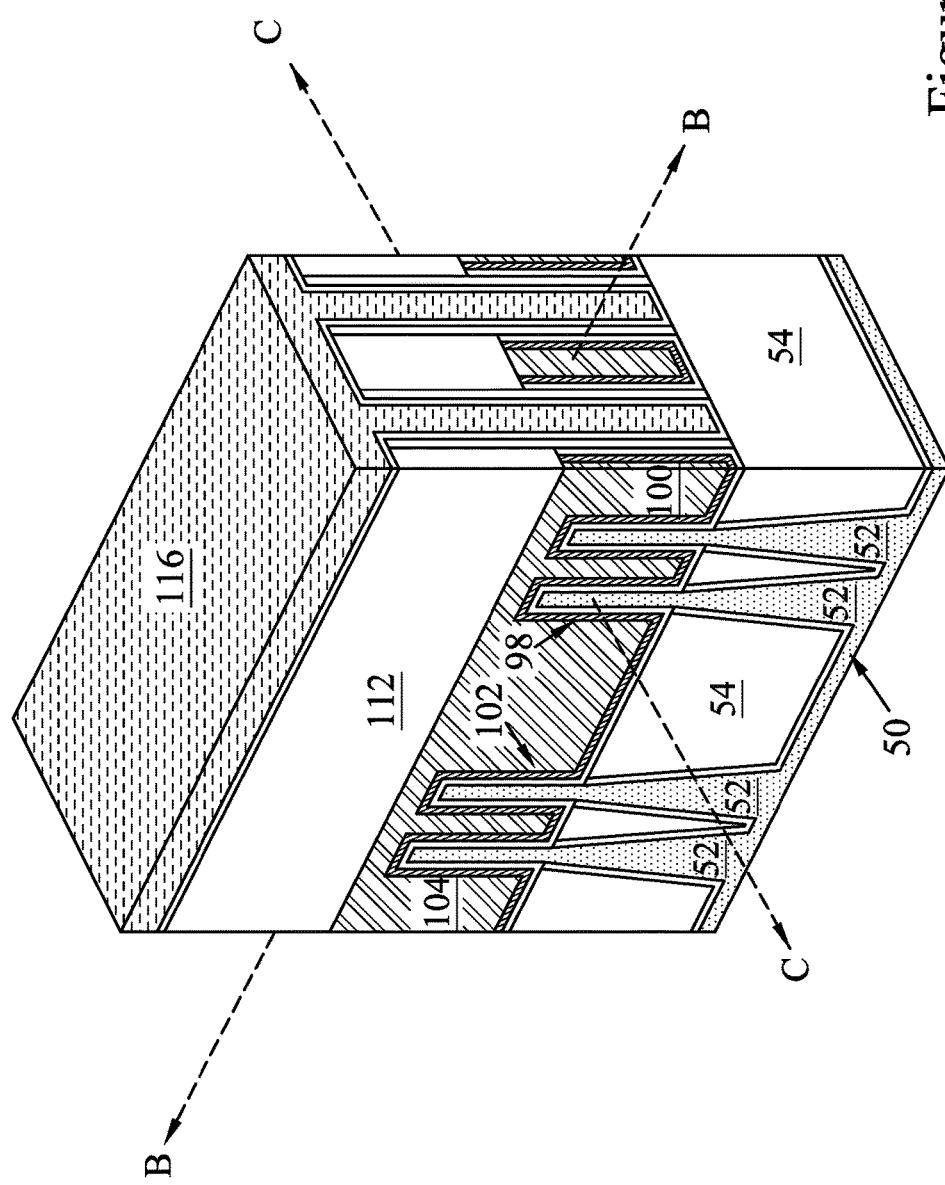
Figure 17B:
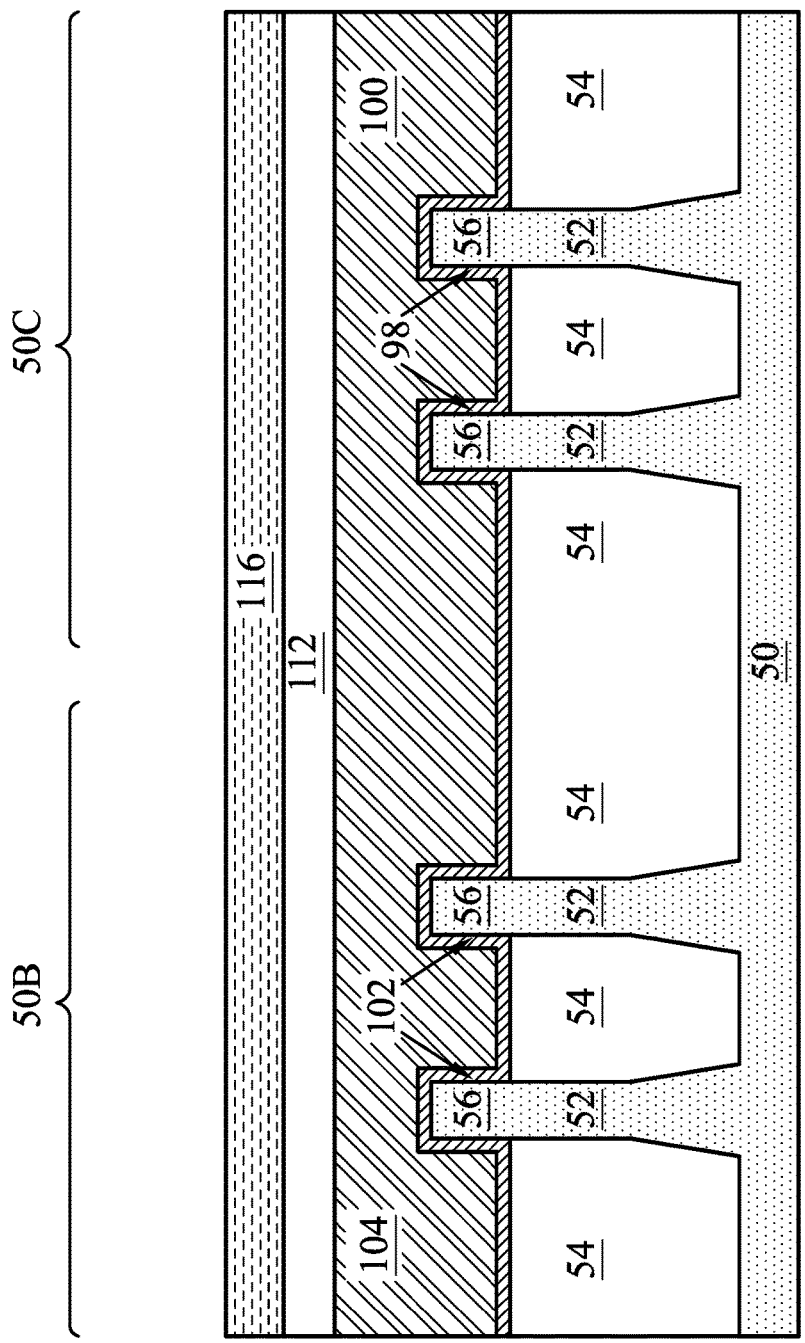
Figure 17C:
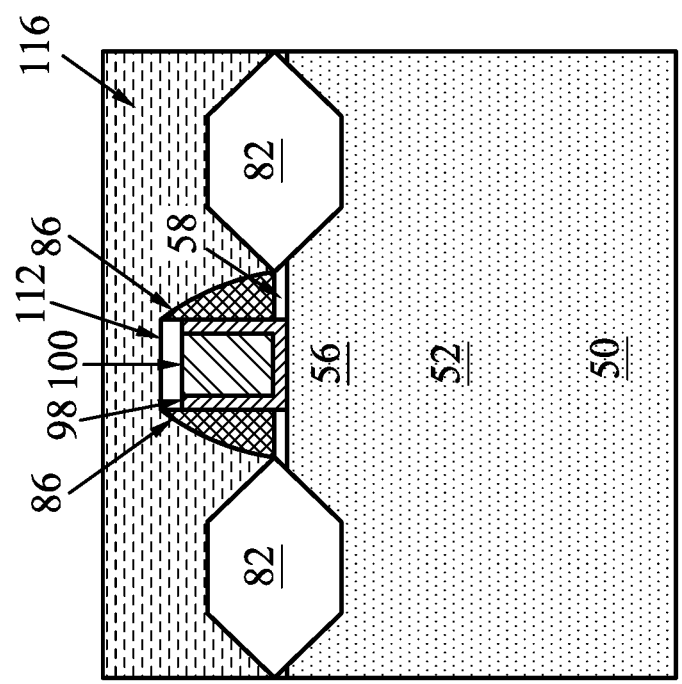

In FIGS. 17A, 17B, and 17C, a dummy contact material 116 is formed in the recesses 114. Excess dummy contact material 116 may also be formed on the gate spacers 86 and the hardmask 112. In some embodiments, a liner (not shown) may be formed in the recesses 114 before the dummy contact material 116 is formed. The liner may include titanium, titanium nitride, tantalum, tantalum nitride, or the like.

The dummy contact material 116 is a SOC material. The SOC material may be dispensed as a liquid, and may be formed from raw materials that include elements such as C, H, O, N, F, Br, and S. The raw materials may have a molecular weight distribution of between about 500 daltons and about 50000 daltons, and in some embodiments may be oxidized and/or polymerized to increase the molecular weight. The SOC material may be between about 50% and about 95% carbon. The raw materials have a skeletal formula that includes aromatic or heteroaromatic substituents. The raw materials may include benzylic carbon or benzyl alcohol; may be conjugated C=C double bonds or triple bonds; and may be from amine, alcohol, carboxylic acid, or amide group. Because the SOC material is dispensed as a liquid, it may have better gap-fill capabilities, and may thus be suitable for filling smaller contact holes. Further, the SOC material may be a solvent with a high boiling point, and may act as a surfactant, further increasing its gap-fill capabilities.

After the dummy contact material 116 is formed, it may be baked in one or more baking steps. Baking the dummy contact material 116 may improve the rate of planarization. Baking may also improve the anisotropic dry etching rate and performance, which may increase the precision of subsequent etching steps (discussed below). The planarization rate and the anisotropic dry etching rate/performance of the dummy contact material 116 varies with the baking temperature and length. The order, temperature, and length of the baking steps determines the planarization rate and anisotropic dry etching rate/performance of the baked dummy contact material 116.

In some embodiments, the dummy contact material 116 may be cured in a first baking step at a lower temperature, and then in a second baking step at a higher temperature. The first baking step may be performed at a temperature of between about 100° C. and about 300° C.; may be repeated up to two times; and may be performed for a time span of between about 30 seconds and about 30 minutes each time. The second baking step may be performed at a temperature of between about 300° C. and about 450° C.; may be repeated up to three times; and may be performed for a time span of between about 1 minute and about 60 minutes each time. A lower baking temperature or time may yield a higher planarization rate, and a higher baking temperature or time may yield a lower planarization rate. During the first baking step and the second baking step, the dummy contact material 116 may be exposed to a baking atmosphere of air, or a baking atmosphere that includes $O_2$, $N_2$, $O_3$, $H_2$, Ar, or combinations thereof. In an example, the dummy contact material 116 may be baked at about 180° C. for about 1 minute, and then at about 350° C. for about 15 minutes, which may yield a planarization rate of about 1200 Å/min. In another example, the dummy contact material 116 may be baked at about 180° C. for about 1 minute, and then at about 360° C. for about 15 minutes, which may yield a planarization rate of about 300 Å/min.

In some embodiments, the dummy contact material 116 may be cured in a single baking step at a higher temperature. For example, the single baking step may be performed in a manner similar to the second baking step explained above. In an example, the dummy contact material 116 may be baked at between about 346° C. and about 348° C., for about 15 minutes, which may respectively yield a planarization rate of between about 1000 Å/min and about 2000 Å/min.

The first region 50B and the second region 50C may be part of a wafer on which multiple semiconductor devices are formed. The planarization rate of the dummy contact material 116 may change at different rates during baking, depending on the location of the dummy contact material 116 on the wafer. An example wafer with a radius of 146 mm may have a center region that includes the inner 120 mm of the wafer, and an edge region that includes the outer 26 mm of the wafer. During baking, the planarization rate of SOC material at the edges of the wafer may increase more rapidly than the planarization rate of SOC material in the center of the wafer. The difference in planarization rates at three standard deviations from the mean of the wafer may be several thousand Å/min. As such, uniformly heating the wafer may result in inconsistent planarization rates across the wafer. The one or more baking steps may be performed by heating the wafer in a non-uniform manner, e.g., heating the edges and center of the wafer to different temperatures. Non-uniform heating may be performed with, e.g., a hot plate that supports multiple heating zones. In some embodiments, the temperature difference between the edges and center of the wafer during baking may be about 10° C. Use of a multi-zone hot plate may allow non-uniform heating of the wafer, resulting in a more uniform planarization rate across the wafer. The multi-zone hot plate may be installed in a Tokyo Electron CLEAN TRACK ACT 12 or a Tokyo Electron CLEAN TRACK LITHIUS Pro.

Figure 18A:
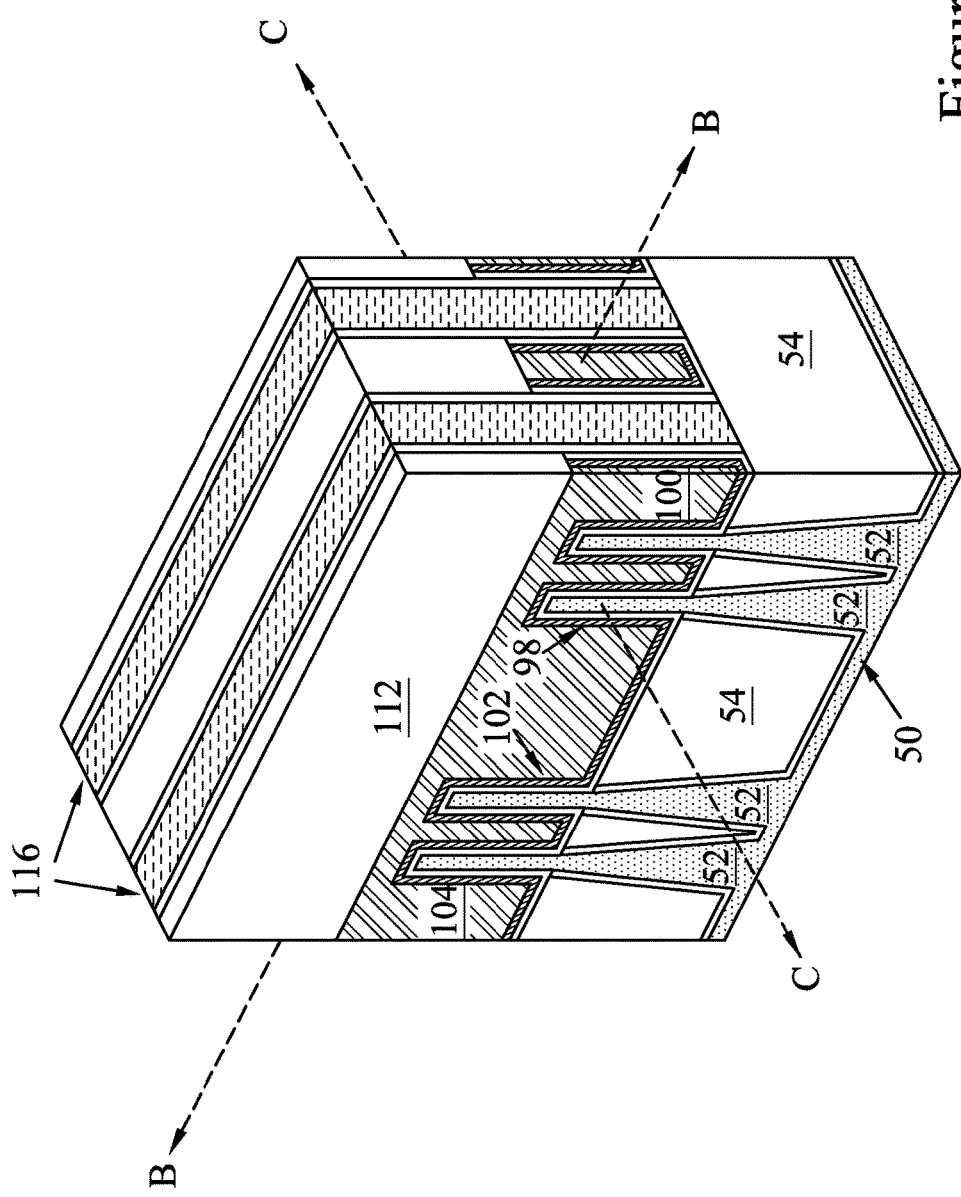
Figure 18B:
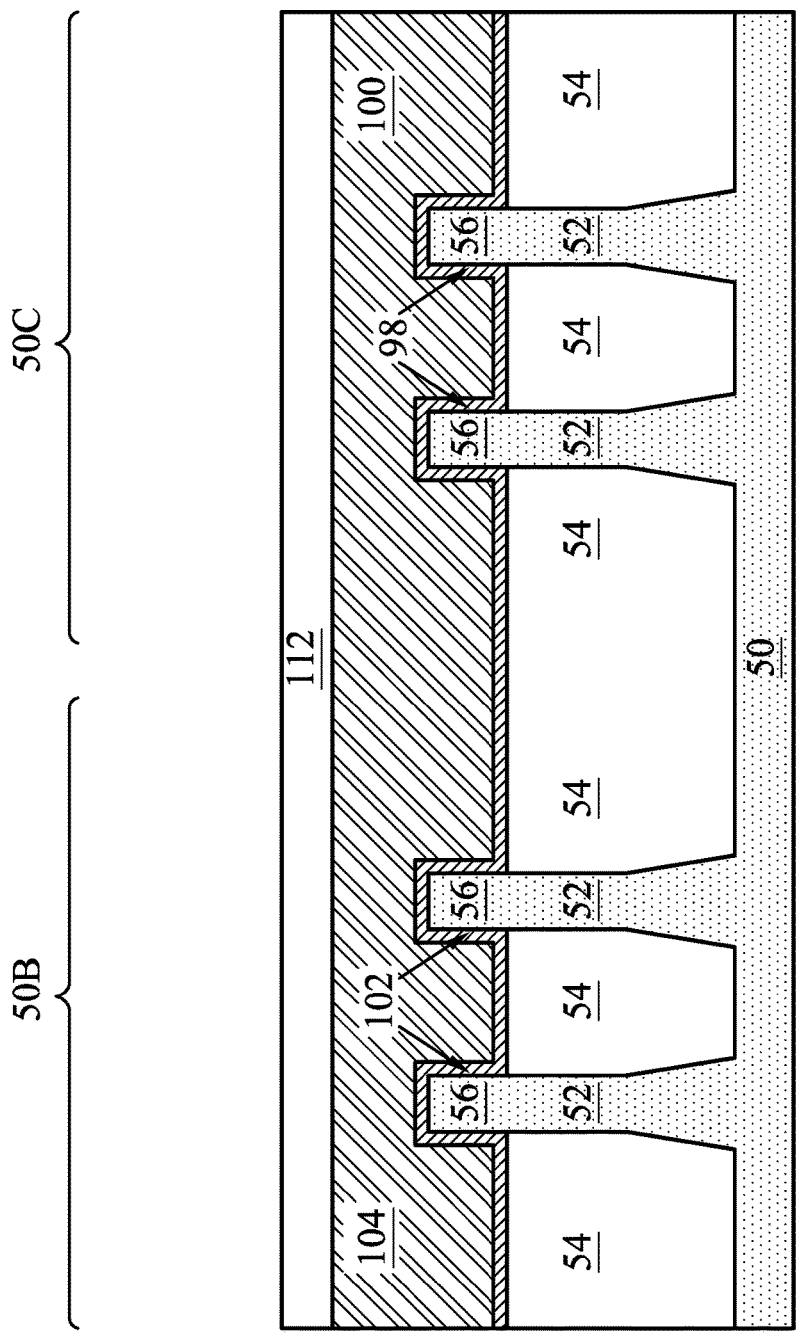
Figure 18C:
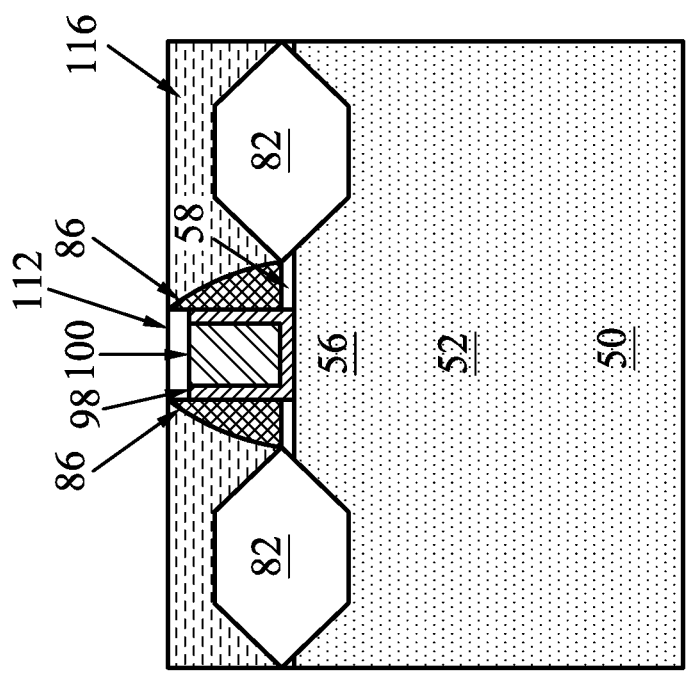

In FIGS. 18A, 18B, and 18C, the dummy contact material 116 is planarized to expose top surfaces of the gate spacers 86 and the hardmask 112. As such, only the dummy contact material 116 in the recesses 114 remains after planarization. The dummy contact material 116 may not have a desired planarization rate after spin-on and baking. As such, in some embodiments, the dummy contact material 116 may be optionally annealed in a furnace before and/or after the planarization, which may further change the rate of planarization.

An optional first furnace anneal may be performed before the planarization. In the first furnace anneal, the dummy contact material 116 is heated to a higher temperature. The first furnace anneal may be performed at a temperature of between about 300° C. and about 500° C., and may be performed for a time span of between about 5 minutes and about 2 hours. During the first furnace anneal, the dummy contact material 116 may be exposed to a baking atmosphere that includes $N_2$, $O_2$, $H_2$, Ar, or combinations thereof, such as $N_2/H_2$, $N_2/O_2$, or $O_2/H_2$. A higher annealing temperature or time may yield a lower planarization rate and higher anisotropic etch performance of the dummy contact material 116. Continuing the example where the dummy contact material 116 is baked at about 180° C. for about 1 minute and then at about 350° C. for about 15 minutes, the dummy contact material 116 may subsequently be annealed at a furnace temperature of about 450° C. In a first example, the annealing may be performed for about 10 minutes, which may reduce the planarization rate from about 1200 Å/min to about 1000 Å/min. In a second example, the annealing may be performed for about 60 minutes, which may reduce the planarization rate from about 1200 Å/min to about 500

Å/min. Although the annealing may reduce the planarization rate of the dummy contact material 116, it may also increase the dry etching performance, yielding a shaper angle during anisotropic etching, better etch selectivity, and faster etching.

After the optional first furnace anneal, the dummy contact material 116 is planarized. The planarization may be performed with a CMP processes, using a variety of parameters. The combination of the baking steps, the optional annealing steps, and the CMP parameters may result in a final planarization rate of between about 100 Å/min and about 3000 Å/min. In some embodiments, the CMP may be performed with a downward pressure of between about 0.5 psi and about 3 psi, and with a platter rotation speed of between about 30 RPM and about 110 RPM. Different slurry types and flow rates may be used. In some embodiments, the slurry may be a colloid based on $SiO_2$, $Al_2O_3$ or $CeO_2$, and may be distributed on the platter at a flow rate of between about 50 mL/min and about 500 mL/min. In some embodiments, a CMP stop layer (not shown) is applied before the dummy contact material 116 is formed and baked. In such embodiments, the removal rate selectivity of the CMP stop layer relative to the SOC material may be greater than 10. The CMP stop layer may be formed from, e.g., Si, SiN, SiC, SiOC, SiON, SiO, and may be formed to a thickness of between about 10 Å and about 500 Å.

An optional second furnace anneal may be performed after the dummy contact material 116 is planarized. The second furnace anneal may be similar to the first furnace anneal, or may be different. Performing the second furnace anneal may allow optimization of the final quality of the dummy contact material 116. Performing the second furnace anneal may increase the density of the dummy contact material 116, which may protect the dummy contact material 116 from plasma damage in subsequent deposition (e.g., CVD) steps. Further, the second furnace anneal may also increase the etch selectivity of the dummy contact material 116.

Although particular baking and annealing temperatures and time lengths have been described above, it should be appreciated that other values may be used. Any combination of baking steps and optional annealing steps may be performed to obtain a desired planarization rate of the dummy contact material 116.

Figure 19A:
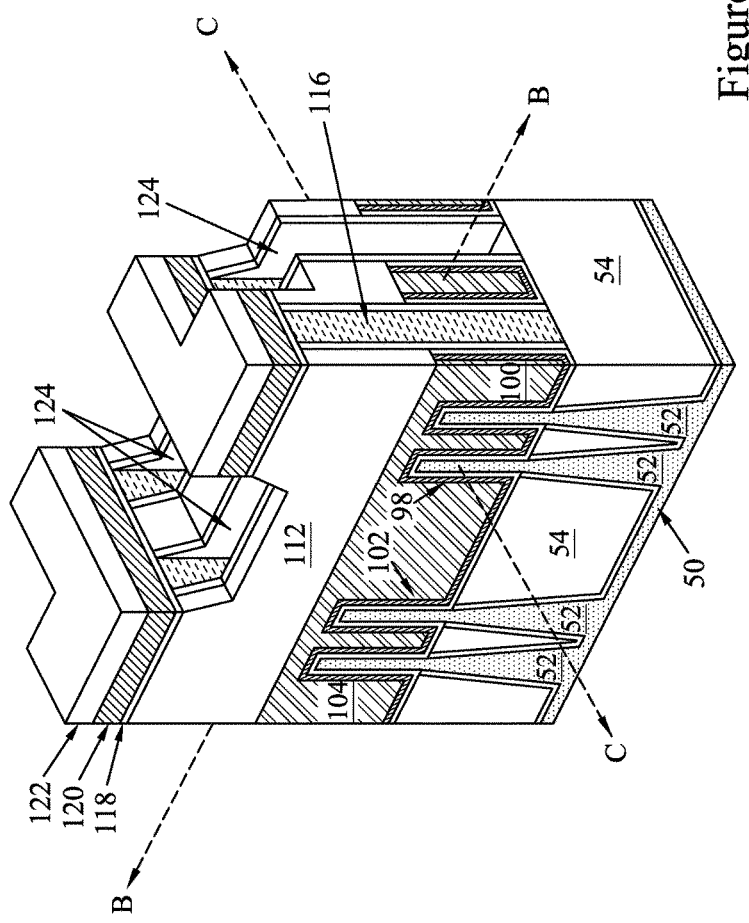
Figure 19B:
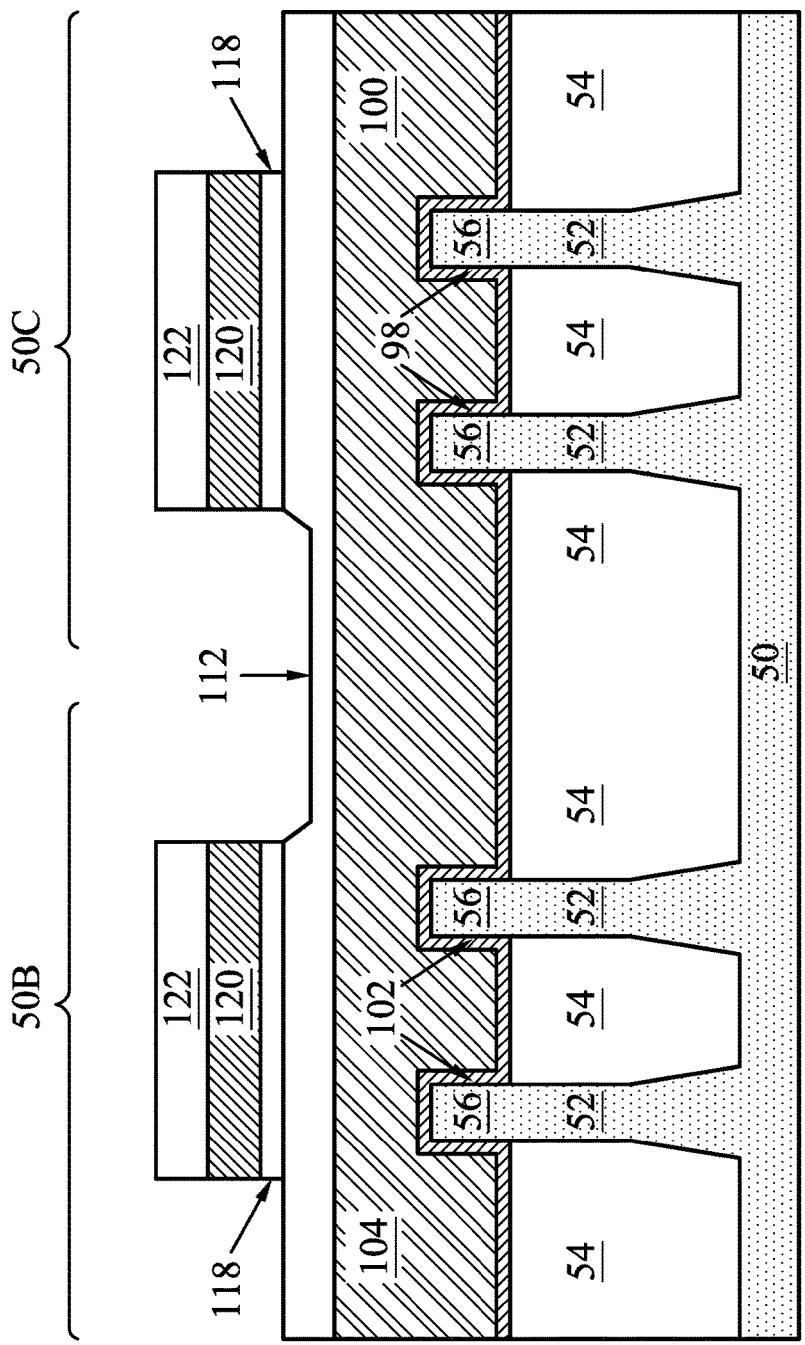
Figure 19C:
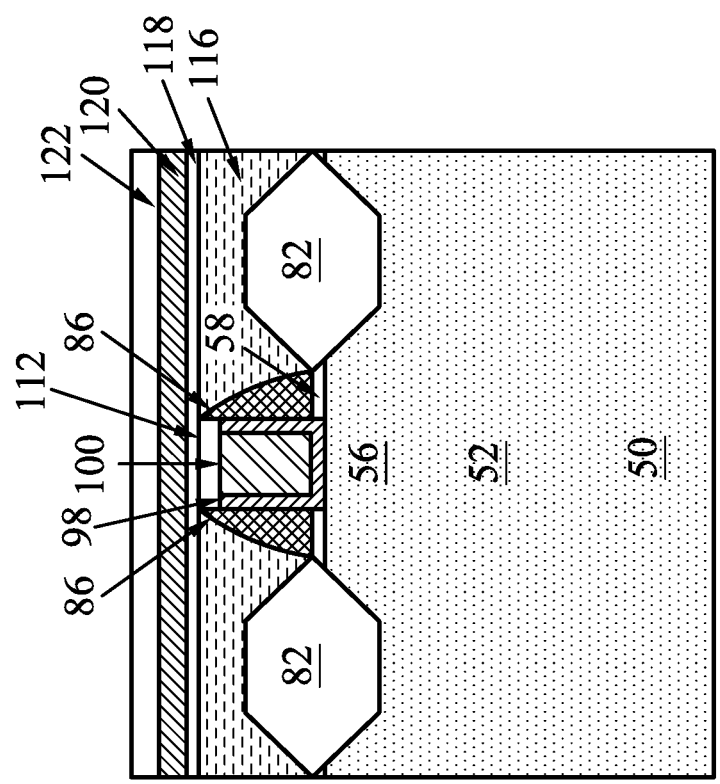

In FIGS. 19A, 19B, and 19C, a pattern for replacement contacts is transferred to the dummy contact material 116 with a tri-layer lithography process. In the tri-layer lithography process, a replacement contact pattern is formed on the dummy contact material 116. The replacement contact pattern includes a bottom anti-reflective coating (BARC) layer 118, an intermediate hardmask layer 120, and a top photoresist layer 122. The top photoresist layer 122 may be patterned using any suitable photolithography technique. For example, a photomask (not shown) may be disposed over the top photoresist layer, which may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser. Exposure of the top photoresist layer may be performed using an immersion lithography system to increase resolution and decrease the minimum achievable pitch. A bake or cure operation may be performed to harden the top photoresist layer 122, and a developer may be used to remove either the exposed or unexposed portions of the top photoresist layer 122 depending on whether a positive or negative resist is used. After the patterning of the top photoresist layer 122, a trimming process may be performed to reduce the width of the top photoresist layer 122. In an embodiment, the trimming process is an anisotropic plasma etch process with process gases including $O_2$, $CO_2$, $N_2/H_2$, $H_2$, the like, a combination thereof, or any other gases suitable for trimming photoresist. After the trimming process, the intermediate hardmask layer 120 and the BARC layer 118 may be patterned, leaving the replacement contact pattern illustrated in FIGS. 19A, 19B, and 19C. Because the dummy contact material 116 is a SOC with a high thermal budget, it may withstand the higher temperatures that it may be exposed to when form the intermediate hardmask layer 120.

Further in FIGS. 19A, 19B, and 19C, the dummy contact material 116 is patterned using the replacement contact pattern as a mask to form openings 124. After the patterning, the dummy contact material 116 remains over the epitaxial source/drain regions 82, and the openings 124 expose portions of the gate electrodes 100 and 104 not covering respective channel regions of the fins 56. In the embodiment shown in FIG. 19A, some of the epitaxial source/drain regions 82 are exposed by the openings 124 and others are not. It should be appreciated that any pattern could be formed.

The patterning of the dummy contact material 116 to form the openings 124 may be performed using a dry etching process that is selective to the dummy contact material 116. The combination of the baking steps, the optional annealing steps, and the etching parameters may result in a final dry etching rate of between about 200 Å/min and about 3000 Å/min. In some embodiments, the dry etching may be performed with etching gases such as $O_2$, $SO_2$, $N_2$, $H_2$, or combinations thereof, such as $O_2/SO_2$ or $N_2/H_2$, and may be dispensed at a flow rate of between about 5 mL/min and about 1000 mL/min. In such embodiments, the etching may be performed at a pressure of between about 1 mTorr and about 100 mTorr; with a source power of between about 200 W and about 5000 W; with a bias power of between about 0 W and about 500 W; and at a temperature of between about 10° C. and about 80° C.

Figure 20A:
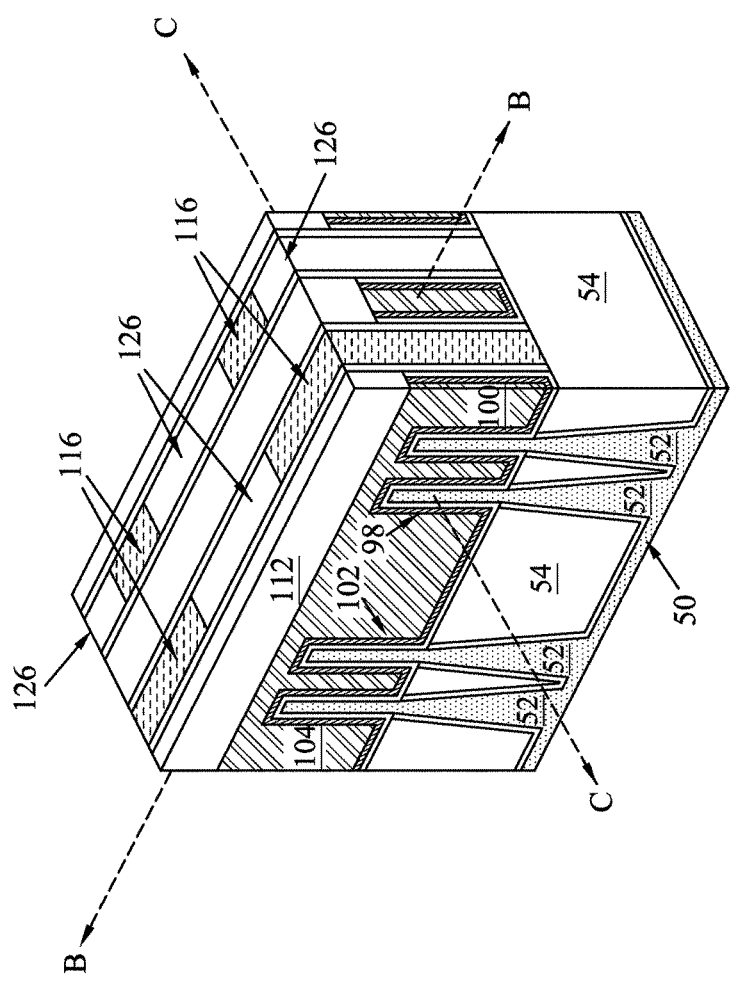
Figure 20B:
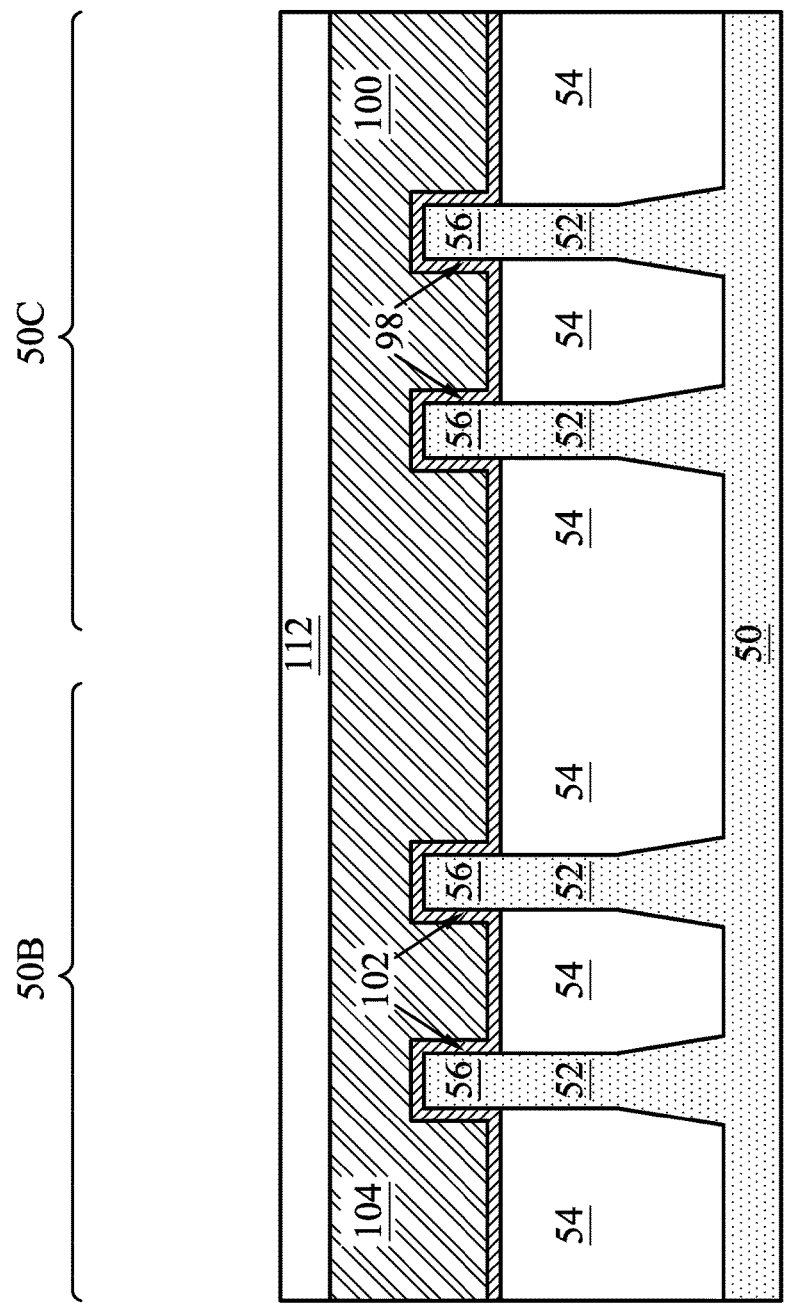
Figure 20C:
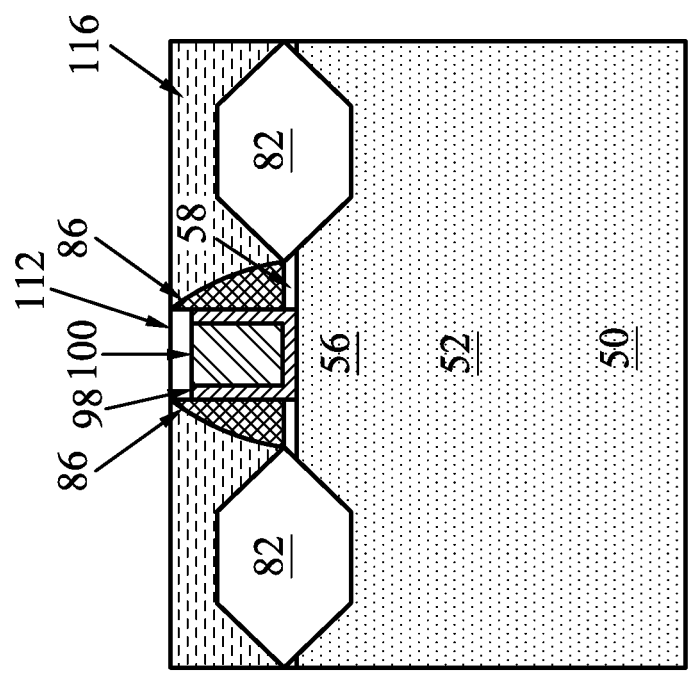

In FIGS. 20A, 20B, and 20C, an ILD 126 is formed in the openings 124. The ILD 126 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), or FCVD. Other insulation materials formed by any acceptable process may be used.

Figure 21A:
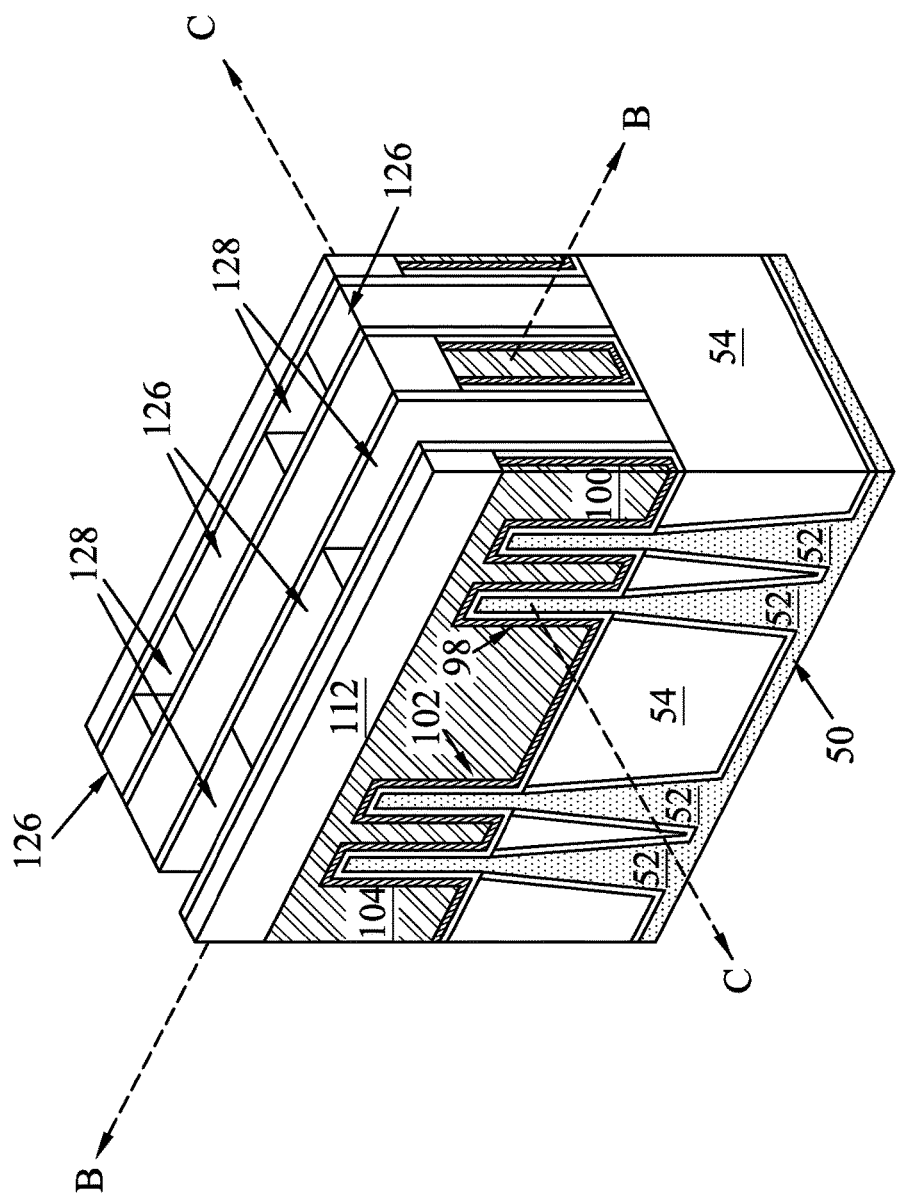
Figure 21B:
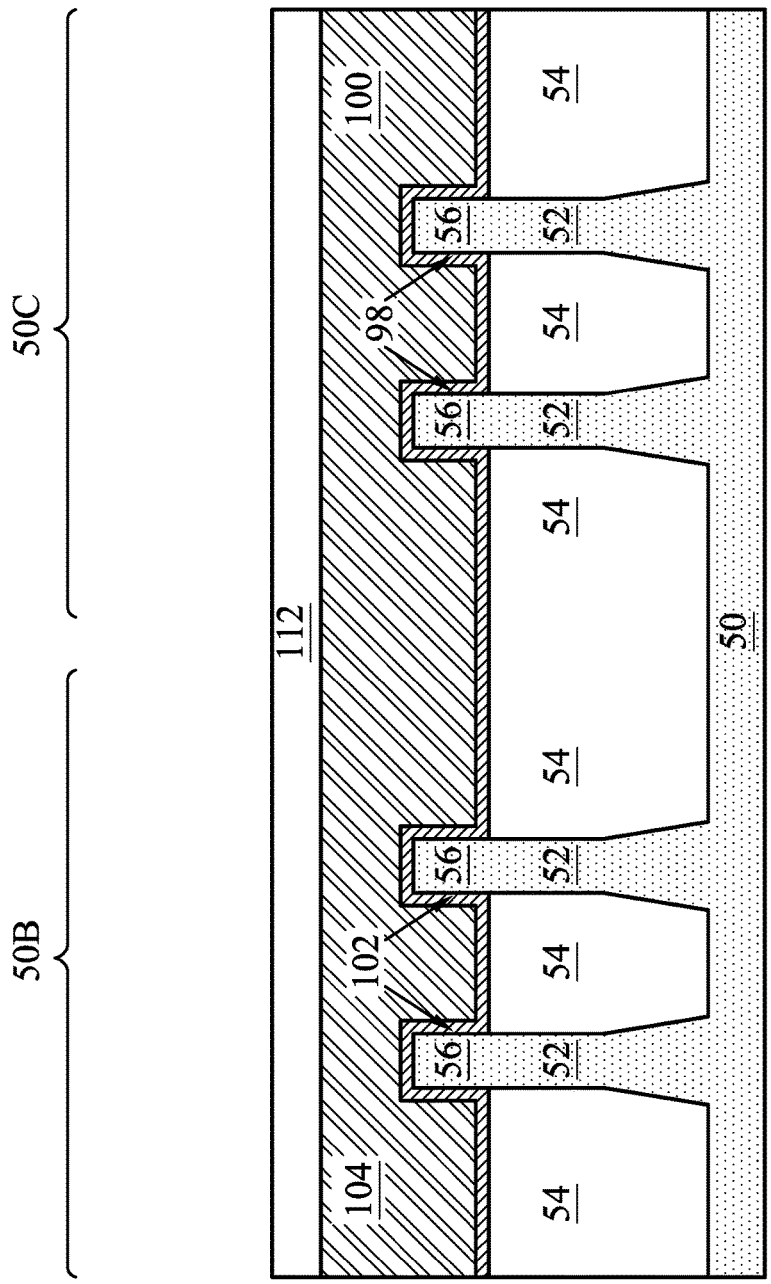
Figure 21C:
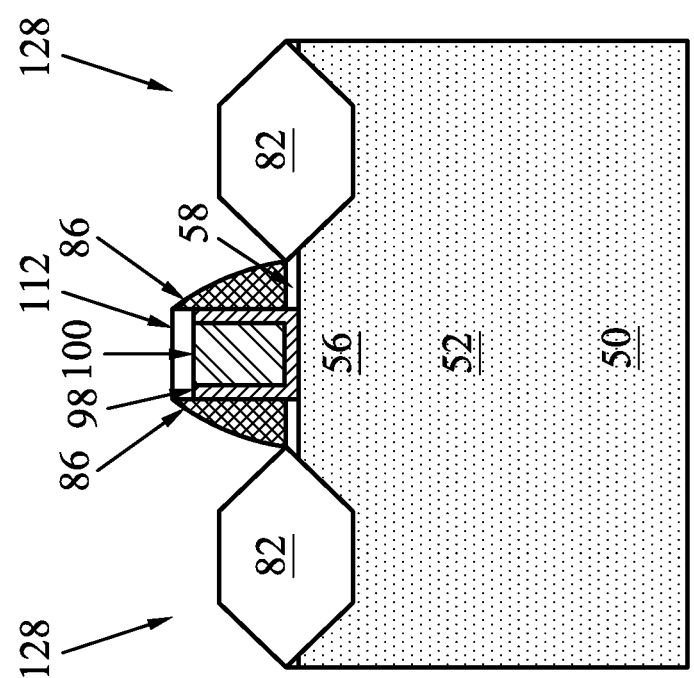

In FIGS. 21A, 21B, and 21C, the dummy contact material 116 is removed, forming openings 128 and exposing the epitaxial source/drain regions 82. The dummy openings 128 may be formed using a similar dry etch process as that used to form the openings 124.

As shown in FIGS. 20A and 21A, the ILD 126 is formed between adjacent groups of fins 52. For example, it may be formed between a first group of fins 52 that form a p-type device, and a second group of fins that form an n-type device. It may also optionally be formed over some of the epitaxial source/drain regions 82. For example, in embodiments where a static random-access memory (SRAM) device is formed, the ILD 126 may cover some of the epitaxial source/drain regions 82 of the fins 52, and remaining ones of the epitaxial source/drain regions 82 may be exposed by the openings 128. In some embodiments, the ILD 126 may only be formed between adjacent fins 52, and all of the epitaxial source/drain regions 82 may be exposed by the openings 128.

Figure 22A:
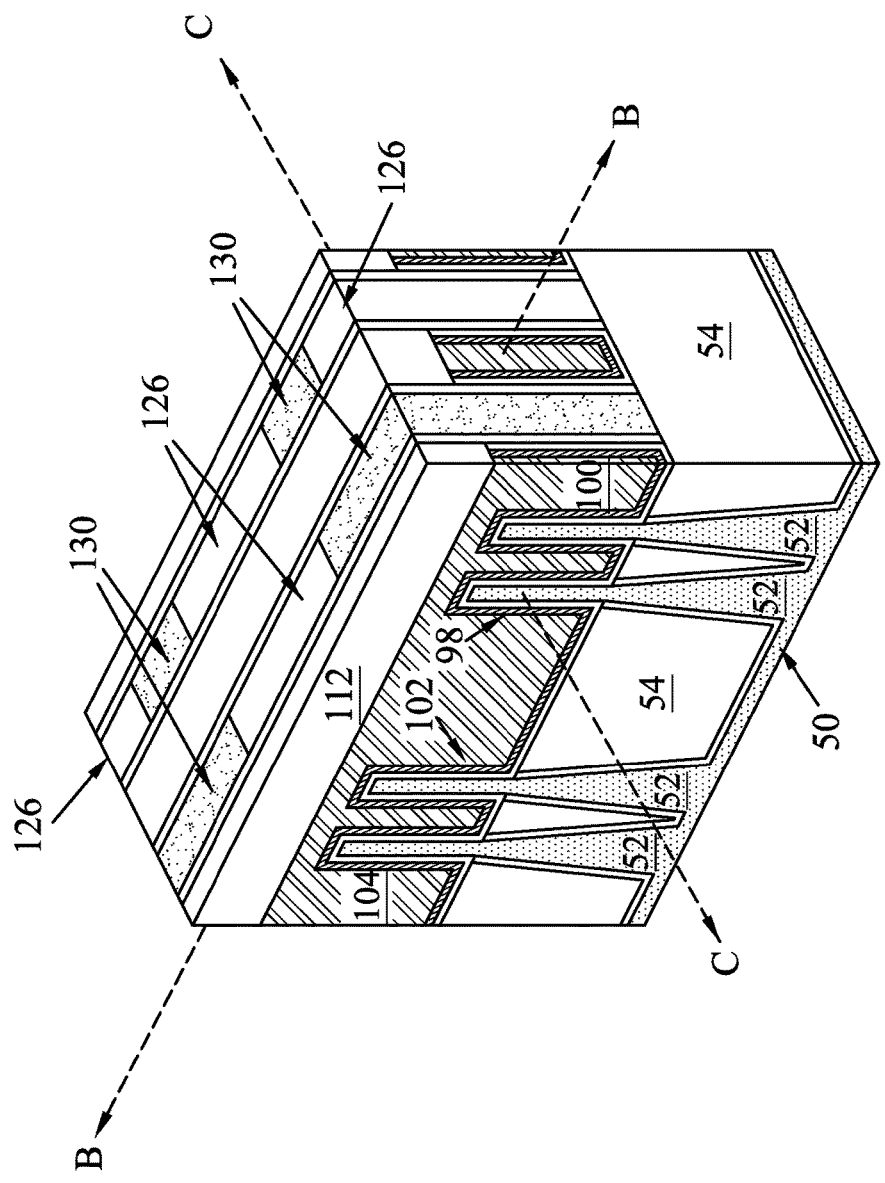
Figure 22B:
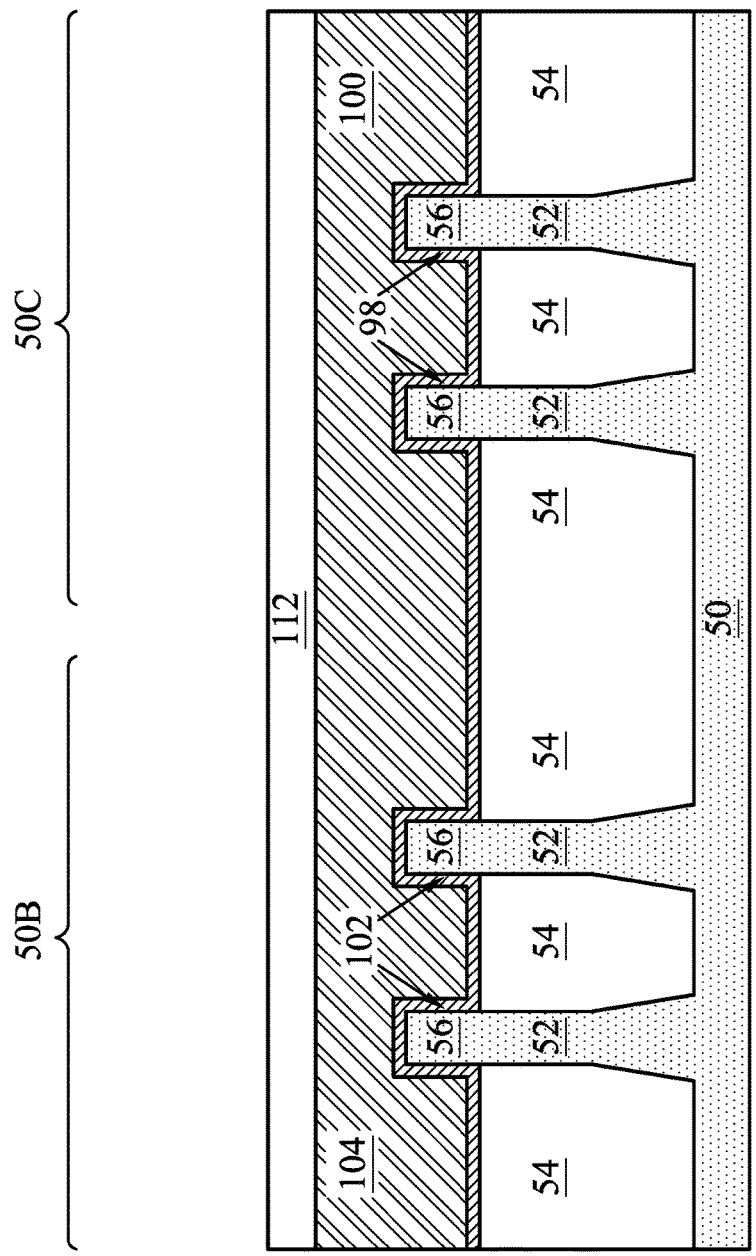
Figure 22C:
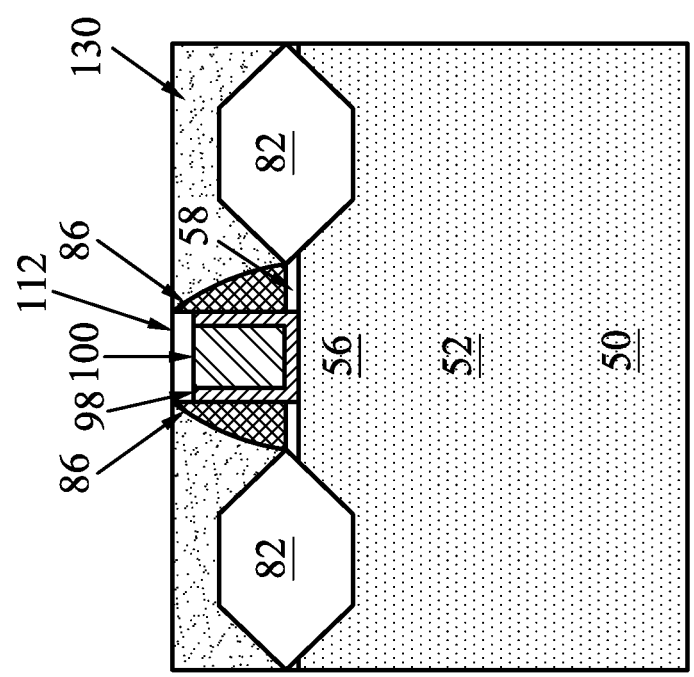

In FIGS. 22A, 22B, and 22C, replacement contacts 130 are formed in the openings 128. A liner, such as a diffusion barrier layer, an adhesion layer, or the like, and a conductive material may be formed in the openings 128. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 126. The remaining liner and conductive material form the replacement contacts 130 in the openings 128. An anneal process may be performed to form a silicide at the interface between the epitaxial source/drain regions 82 and the replacement contacts 130. The replacement contacts 130 are electrically coupled to the epitaxial source/drain regions 82. A gate contact may then be formed through the hardmask 112, physically and/or electrically contacting the gate electrodes 100 and 104.

Embodiments may achieve advantages. Because the SOC dummy contact material is spun-on as a liquid, it has gap-fill capabilities suitable for devices with small contact holes. Embodiment SOC materials may have a thermal budget greater than about 400° C., which may preserve the material when subsequent masking layers are formed. The planarization and etching rates of embodiment SOC materials may be controlled in baking and annealing steps. Finally, embodiment SOC materials may have a higher anisotropic dry etching performance, producing a vertical angle of greater than about 88° in some dry etching processes.

According to an embodiment, a method includes forming a recess exposing a plurality of semiconductor fins on a wafer, forming a dummy contact material in the recess, the dummy contact material containing carbon, curing the dummy contact material with one or more baking steps, the one or more baking steps hardening the dummy contact material, replacing a first portion of the dummy contact material with an inter-layer dielectric (ILD), and replacing a second portion of the dummy contact material with a plurality of contacts, the plurality of contacts electrically coupled to source/drain regions of the plurality of semiconductor fins.

According to an embodiment, a method includes forming a dummy inter-layer dielectric (ILD) adjacent a metal gate, the dummy ILD and the metal gate covering a first semiconductor fin and a second semiconductor fin, recessing the metal gate to form a first recess, forming a mask layer in the first recess and over the metal gate, removing the dummy ILD to form a second recess, spinning a carbon coating on the mask layer and in the second recess, curing the carbon coating to increase a planarization rate and an etch rate of the carbon coating, planarizing the carbon coating to expose top surfaces of the mask layer and a top surface of the carbon coating in the second recess, replacing a first portion of the carbon coating with an ILD, and replacing a second portion of the carbon coating with contacts electrically coupled to source/drain regions of the first semiconductor fin and the second semiconductor fin.

According to an embodiment, a method includes forming a dummy inter-layer dielectric (ILD) over a plurality of semiconductor fins, replacing the dummy ILD with a spin-on carbon material, patterning the spin-on carbon material with a replacement contact pattern, the patterning including etching recesses the spin-on carbon material with a dry etch, and forming replacement contacts in the recesses, the replacement contacts coupled to source/drain regions of the plurality of semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a recess exposing a plurality of semiconductor fins on a wafer;
    forming a dummy contact material in the recess, the dummy contact material containing carbon;
    curing the dummy contact material with one or more baking steps, the one or more baking steps hardening the dummy contact material;
    replacing a first portion of the dummy contact material with an inter-layer dielectric (ILD); and
    replacing a second portion of the dummy contact material with a plurality of contacts, the plurality of contacts electrically coupled to source/drain regions of the plurality of semiconductor fins.

2. The method of claim 1, wherein curing the dummy contact material comprises:
    heating the dummy contact material at a first temperature for a first time period.

3. The method of claim 2, wherein curing the dummy contact material further comprises:
    after the first time period, heating the dummy contact material at a second temperature for a second time period, the second temperature greater than the first temperature.

4. The method of claim 3, wherein the first temperature is less than about 300° C., and the second temperature is greater than about 300° C.

5. The method of claim 3, wherein the first time period is between about 30 seconds and about 30 minutes, and the second time period is between about 1 minute and about 60 minutes.

6. The method of claim 1, wherein heating the dummy contact material comprises heating edges of the wafer to a higher temperate than the center of the wafer.

7. The method of claim 6, wherein the edges of the wafer are heated to about 10° C. warmer than the center of the wafer.

8. The method of claim 6, wherein heating the edges of the wafer to a higher temperate than the center of the wafer comprises heating the wafer with a multi-zone hot plate.

9. The method of claim 1, further comprising:
    before forming the dummy contact material, forming a mask over channel regions of the plurality of semiconductor fins; and
    planarizing the dummy contact material to expose a top surface of the mask.

10. The method of claim 9, further comprising:
    before planarizing the dummy contact material, annealing the dummy contact material in a first annealing step, the first annealing step reducing a planarization rate of the dummy contact material.

11. The method of claim 10, further comprising:
after planarizing the dummy contact material, annealing the dummy contact material in a second annealing step, the second annealing step further reducing the planarization rate of the dummy contact material.

12. A method comprising:
forming a dummy inter-layer dielectric (ILD) adjacent a metal gate, the dummy ILD and the metal gate covering a first semiconductor fin and a second semiconductor fin;
recessing the metal gate to form a first recess;
forming a mask layer in the first recess and over the metal gate;
removing the dummy ILD to form a second recess;
spinning a carbon coating on the mask layer and in the second recess;
curing the carbon coating to increase a planarization rate and an etch rate of the carbon coating;
planarizing the carbon coating to expose top surfaces of the mask layer and a top surface of the carbon coating in the second recess;
replacing a first portion of the carbon coating with an ILD; and
replacing a second portion of the carbon coating with contacts electrically coupled to source/drain regions of the first semiconductor fin and the second semiconductor fin.

13. The method of claim 12, wherein replacing the first portion of the carbon coating with the ILD comprises:
etching the carbon coating with a dry etch process to form third recesses in the carbon coating; and
depositing the ILD in the third recesses.

14. The method of claim 13, wherein replacing the second portion of the carbon coating with the contacts comprises:
etching the carbon coating with the dry etch process to form fourth recesses in the carbon coating; and
depositing a conductive material in the fourth recesses.

15. The method of claim 13, wherein the ILD is between the first semiconductor fin and the second semiconductor fin.

16. The method of claim 13, wherein the ILD is over at least one source/drain region of the first semiconductor fin or the second semiconductor fin.

17. A method comprising:
forming a dummy inter-layer dielectric (ILD) over a plurality of semiconductor fins;
replacing the dummy ILD with a spin-on carbon material;
patterning the spin-on carbon material with a replacement contact pattern, the patterning comprising etching recesses in the spin-on carbon material with a dry etch; and
forming replacement contacts in the recesses, the replacement contacts coupled to source/drain regions of the plurality of semiconductor fins.

18. The method of claim 17, wherein the spin-on carbon material is between about 50% and about 95% carbon.

19. The method of claim 17, wherein the spin-on carbon material has an aromatic or heteroaromatic skeletal formula.

20. The method of claim 17, wherein the spin-on carbon material comprises benzylic carbon or benzyl alcohol, is one of a conjugated C=C double or triple bond, and is from an amine, alcohol, carboxylic acid, or amide group.

* * * * *